US007204008B2

(12) United States Patent
Eldridge

(10) Patent No.: US 7,204,008 B2
(45) Date of Patent: *Apr. 17, 2007

(54) METHOD OF MAKING AN ELECTRONICS MODULE

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 203 days.

This patent is subject to a terminal disclaimer.

(21) Appl. No.: 10/609,263

(22) Filed: Jun. 26, 2003

(65) Prior Publication Data

US 2004/0096994 A1 May 20, 2004

Related U.S. Application Data

(62) Division of application No. 09/955,258, filed on Sep. 12, 2001, now Pat. No. 6,764,869.

(51) Int. Cl.
*G01R 31/28* (2006.01)
(52) U.S. Cl. .................. 29/593; 29/592.1; 29/831; 29/832; 324/763; 324/765; 324/158.1; 438/14; 438/17
(58) Field of Classification Search ........... 29/592.1, 29/593, 831, 832; 324/763, 765, 158.1; 438/14, 17
See application file for complete search history.

(56) References Cited

U.S. PATENT DOCUMENTS

| 4,538,867 | A | 9/1985 | Wilson et al. |
| 5,101,149 | A | 3/1992 | Adams et al. |
| 5,438,749 | A | 8/1995 | Runyon |
| 5,461,544 | A | 10/1995 | Ewers |
| 5,578,527 | A | 11/1996 | Chang et al. |
| 5,589,765 | A | 12/1996 | Ohmart et al. |
| 5,614,838 | A | 3/1997 | Jaber et al. |
| 5,640,762 | A | 6/1997 | Farnworth et al. |
| 5,682,064 | A | 10/1997 | Atkins et al. |
| 5,772,451 | A | 6/1998 | Dozier, II et al. |
| 5,781,766 | A | 7/1998 | Davis |
| 5,807,762 | A | 9/1998 | Akram et al. |
| 5,829,128 | A | 11/1998 | Eldridge et al. |

(Continued)

FOREIGN PATENT DOCUMENTS

JP 01-100472 4/1989

(Continued)

OTHER PUBLICATIONS

International Search Report for PCT application PCT/US 02/29139, which claims priority to U.S. Appl. No. 09/955,258.

*Primary Examiner*—Paul D. Kim
(74) *Attorney, Agent, or Firm*—N. Kenneth Burraston

(57) ABSTRACT

An electronics module is assembled by demountably attaching integrated circuits to a module substrate. The module is then tested at a particular operating speed. If the module fails to operate correctly at the tested speed, the integrated circuit or circuits that caused the failure are removed and replaced with new integrated circuits, and the module is retested. Once it is determined that the module operates correctly at the tested speed, the module may be rated to operate at the tested speed and sold, or the module may be tested at a higher speed.

25 Claims, 25 Drawing Sheets

U.S. PATENT DOCUMENTS

| | | |
|---|---|---|
| 5,917,707 A | 6/1999 | Khandros et al. |
| 5,991,215 A | 11/1999 | Brunelle |
| 6,029,344 A | 2/2000 | Khandros et al. |
| 6,031,382 A | 2/2000 | Nakaizumi |
| 6,032,356 A | 3/2000 | Eldridge et al. |
| 6,033,935 A | 3/2000 | Dozier, II et al. |
| 6,055,463 A | 4/2000 | Cheong et al. |
| 6,061,507 A | 5/2000 | Fitzgerald et al. |
| 6,064,213 A | 5/2000 | Khandros et al. |
| 6,107,812 A | 8/2000 | Pivnichny et al. |
| 6,110,823 A | 8/2000 | Eldridge et al. |
| 6,147,316 A | 11/2000 | Beffa |
| 6,209,110 B1 | 3/2001 | Chhor et al. |
| 6,210,984 B1 | 4/2001 | Farnworth et al. |
| 6,219,908 B1 | 4/2001 | Farnworth et al. |
| 6,238,942 B1 * | 5/2001 | Farnworth .................. 438/15 |
| 6,269,467 B1 | 7/2001 | Chang et al. |
| 6,287,878 B1 | 9/2001 | Maeng et al. |
| 6,324,653 B1 | 11/2001 | Lisart et al. |
| 6,324,657 B1 | 11/2001 | Fister et al. |
| 6,329,832 B1 | 12/2001 | Cobbley et al. |
| 6,362,637 B2 | 3/2002 | Farnworth et al. |
| 6,383,822 B1 | 5/2002 | Sprayberry et al. |
| 6,395,566 B2 | 5/2002 | Farnworth |
| 6,414,509 B1 | 7/2002 | Bhatt et al. |
| 6,426,637 B1 | 7/2002 | Dang et al. |
| 2002/0025608 A1 | 2/2002 | Shinonaga et al. |
| 2002/0132379 A1 | 9/2002 | Chang |

FOREIGN PATENT DOCUMENTS

| | | |
|---|---|---|
| WO | WO 00/01208 A1 | 1/2000 |
| WO | WO 00/33360 | 6/2000 |
| WO | WO 00/35262 A2 | 6/2000 |

* cited by examiner

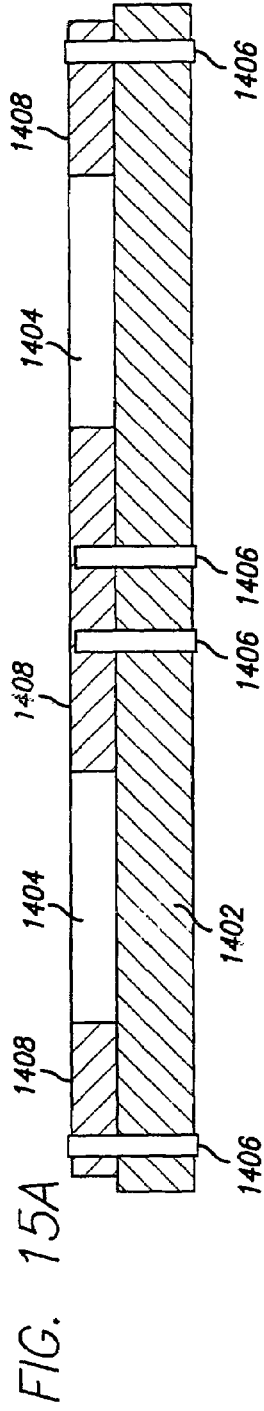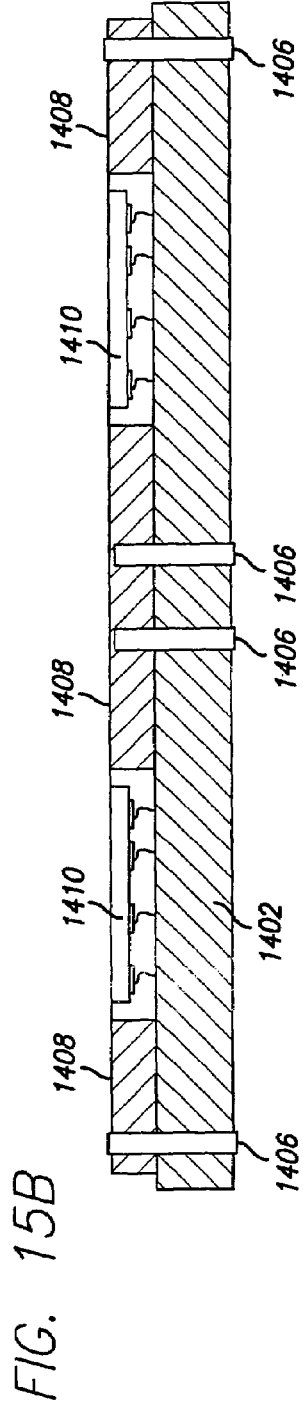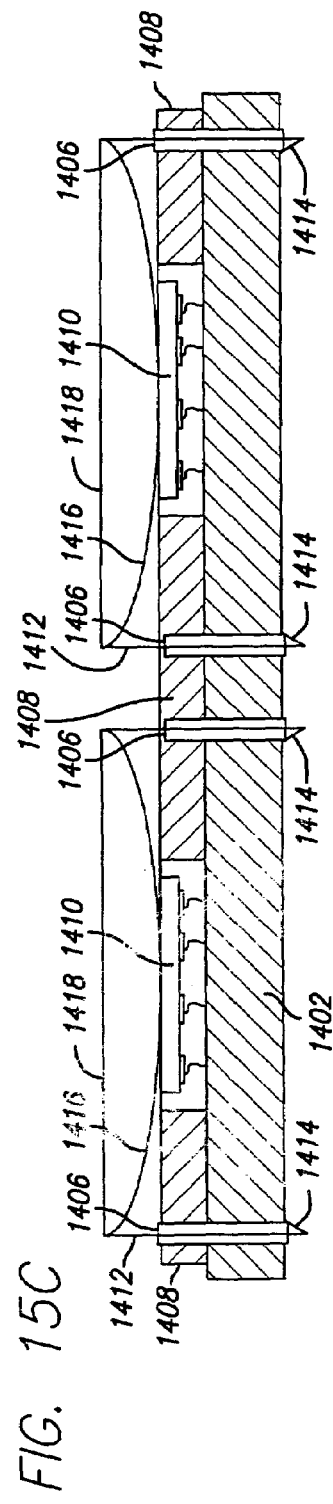

FIG. 20A
PRIOR ART
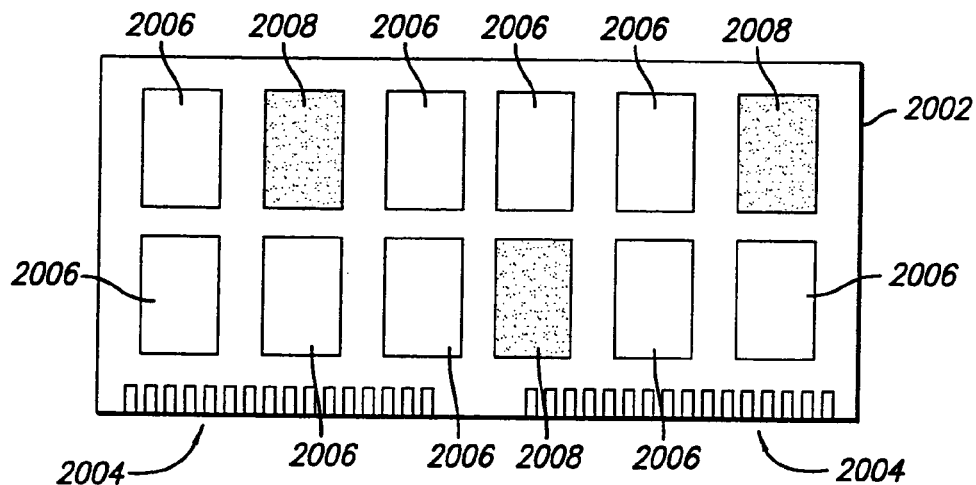
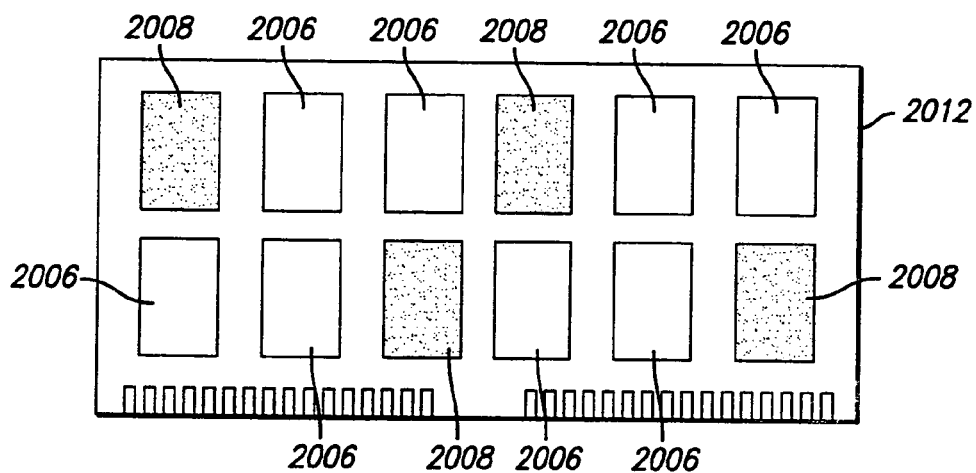
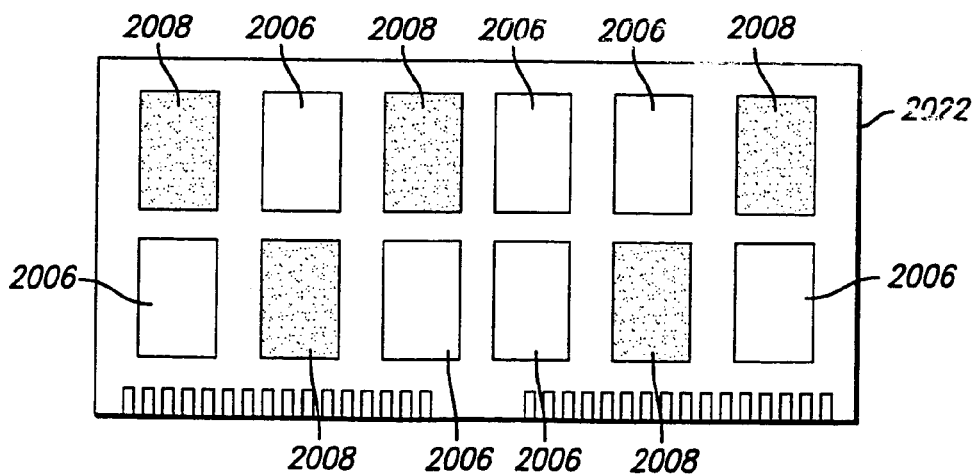

FIG. 20B
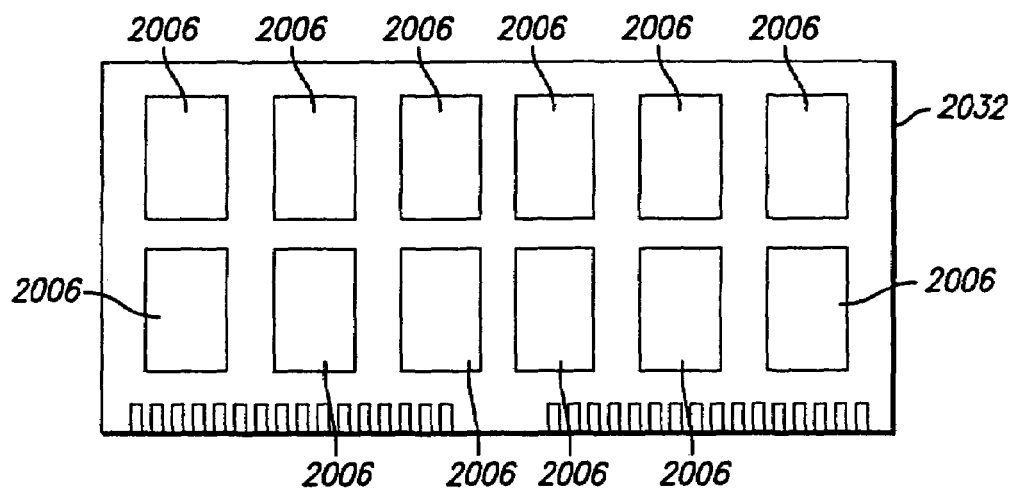
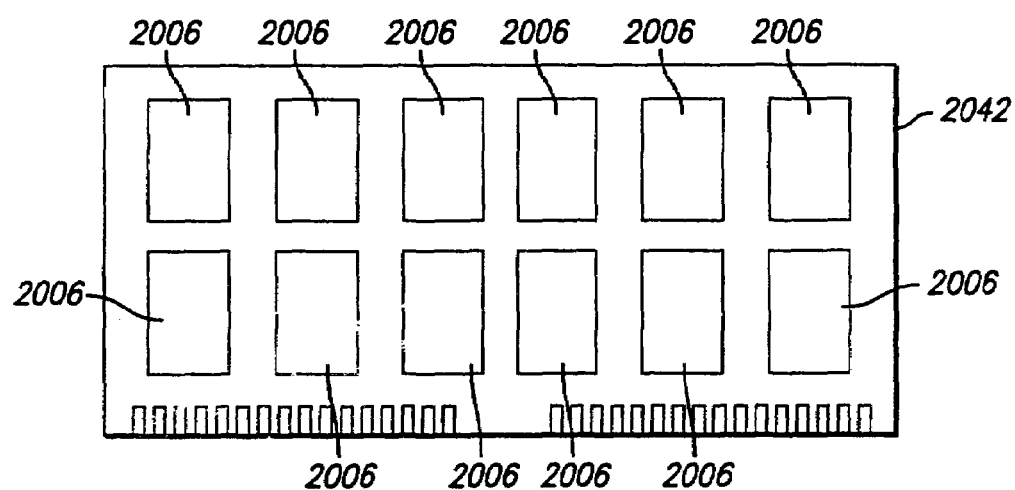
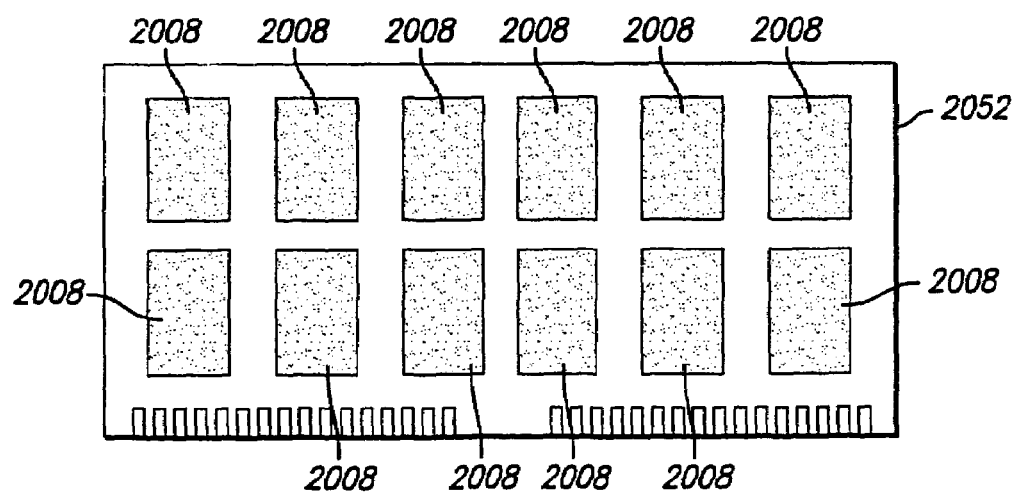

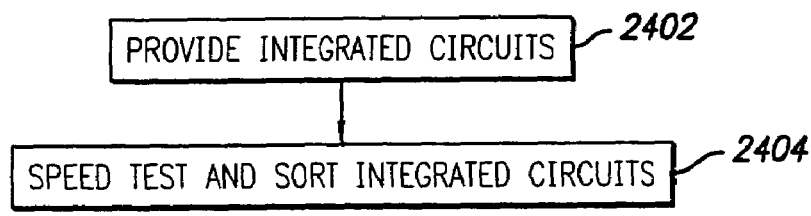
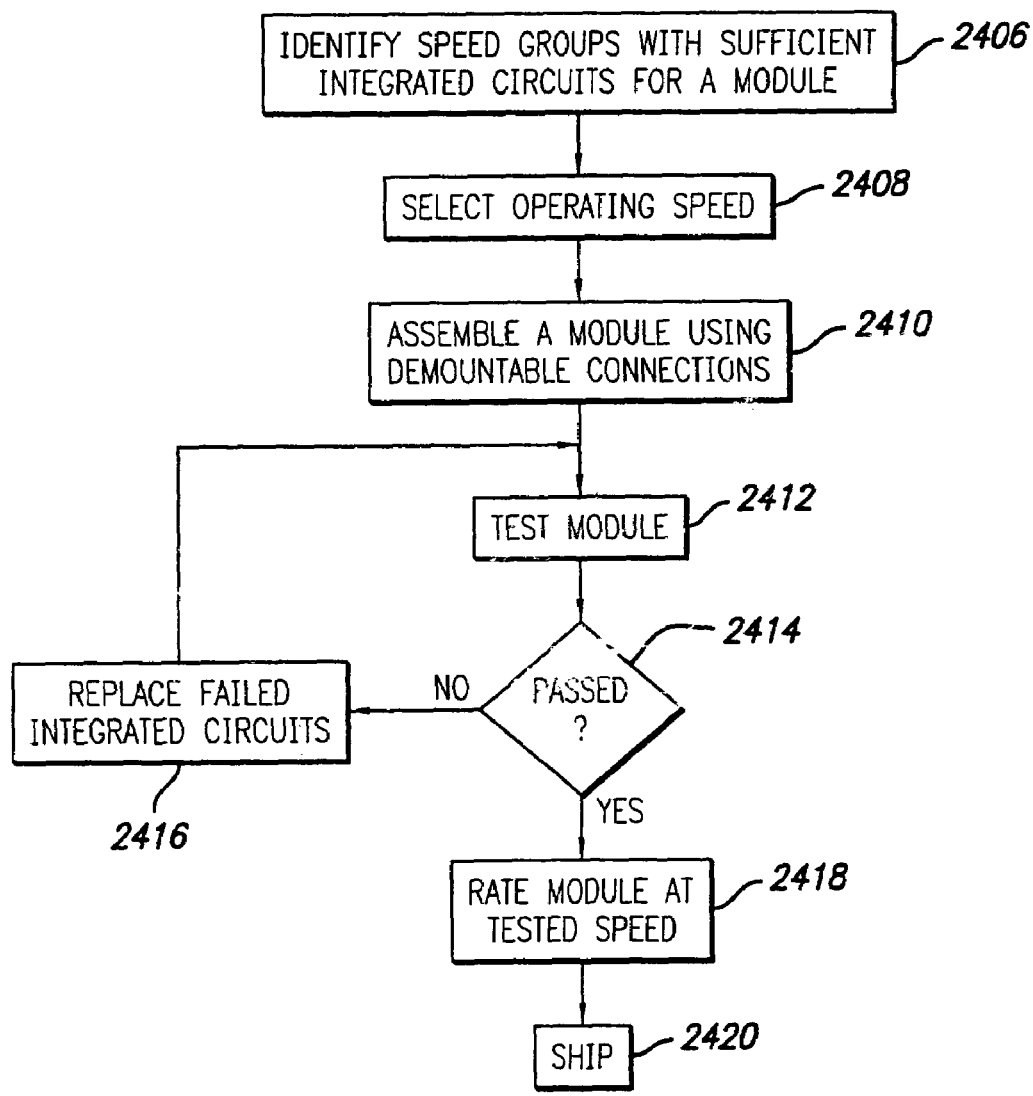

METHOD OF MAKING AN ELECTRONICS MODULE

This application is a divisional of U.S. patent application ser. No. 09/955,258, filed Sep. 12, 2001, now U.S. Pat. No. 6,764,869.

BACKGROUND OF THE INVENTION

1. Field of the Invention

The present invention is directed to an improved method of assembling and testing an electronics module, and more particularly, to the use of demountable interconnections to allow removal and replacement of individual integrated circuits composing the module.

2. Background

Modern day electronics or computer systems often include one or more electronics modules comprising a module board, such as a printed circuit board, onto which a number of integrated circuits are mounted. The module board typically includes conductive traces for such things as interconnecting the integrated circuits; bringing power, ground, and/or voltage reference signals onto the module board and to the integrated circuits; and bringing data, control, timing, clock, and/or other signals onto and off of the module board. The module board also typically includes connectors for connecting to other module boards, other modules, or other elements of the overall electronics system. Often such an electronics module must be capable of reliably functioning at a given clock speed, data rate, or operating speed (hereinafter referred to collectively as "operating speed" or simply "speed"). Typically, such a module is sold to customers with an assurance that the module is capable of operating at its rated speed.

FIG. 1 illustrates steps common in prior art methods of making, rating, and testing electronics modules to ensure that they are capable of operating at a particular speed. Initially, integrated circuits, which may be microprocessors, memories, microcontrollers, analog circuits, digital signal processing circuits, or any other kind of integrated circuit, are manufactured 102. Typically, each integrated circuit is individually tested to determine its maximum operating speed 104. The actual tested operating speed of each integrated circuit, however, must be down graded 106. The primary reason for the need to down grade is that the environment in which the integrated circuit is tested is different than the module environment. For example, the integrated circuit is typically tested by itself but will operate in a system comprising other integrated circuits and a module board with interconnections. Indeed, the interconnections on the module board providing signal paths between integrated circuits and to connections off of the module board by themselves may introduce parasitics that may significantly reduce the operating speed of the integrated circuit.

Down grading the tested operating speed of the integrated circuit provides a safety margin (some times referred to as a "guard band") that increases the likelihood that a module will be capable of operating at the rated speed (as down graded) of its constituent integrated circuits. Once individually tested and rated, the integrated circuits are sorted (or "binned") by their down graded speed rating 108.

A module intended to operate at a particular speed is assembled by selecting integrated circuits sorted into the group or bin that corresponds to that operating speed 110. The assembled modules are then tested 112. Modules that pass are sold and shipped to customers 114, while modules that fail are typically discarded.

As should be apparent, the practice of guard banding introduces inefficiencies into the process of making electronic modules. For example, some, if not many, of the integrated circuits would be capable of operating at a higher speed than their down graded rating in the module environment. Guard banding these integrated circuits results in use of less than the full capability of the integrated circuits. On the other hand, if the integrated circuits are not guard banded, those that will not function properly at their tested speed in a module environment will cause any module in which they are included to fail. Thus, a way of minimizing or eliminating the need to guard band integrated circuits without causing significant numbers of assembled modules to fail is needed.

BRIEF SUMMARY OF THE INVENTION

The present invention is directed to an improved method of assembling and testing an electronics module. A module is assembled by demountably attaching integrated circuits to a module substrate. The module is then tested at a particular operating speed. If the module fails to operate correctly at the tested speed, the integrated circuit or circuits that caused the failure are removed and replaced with new integrated circuits, and the module is retested. Once it is determined that the module operates correctly at the tested speed, the module may be rated to operate at the tested speed and sold, or the module may be tested at a higher speed.

BRIEF DESCRIPTION OF THE DRAWINGS

FIGS. 15A–15C illustrates side-cross sectional views of FIGS. 14A–14C.

FIG. 20A illustrates three exemplary modules assembled using the prior art method illustrated in FIG. 1.

FIG. 20B illustrates three exemplary modules assembled using the embodiment of FIG. 2.

FIGS. 24A and 24B illustrate still another exemplary embodiment of the invention in which a module is assembled and tested.

DETAILED DESCRIPTION OF EMBODIMENTS OF THE INVENTION

The present invention is directed to an improved method of assembling and testing an electronics module. The following specification describes exemplary embodiments and applications of the invention. The invention, however, is not limited to these exemplary embodiments and applications or to the manner in which the exemplary embodiments and applications operate or are described herein.

Figure 2:
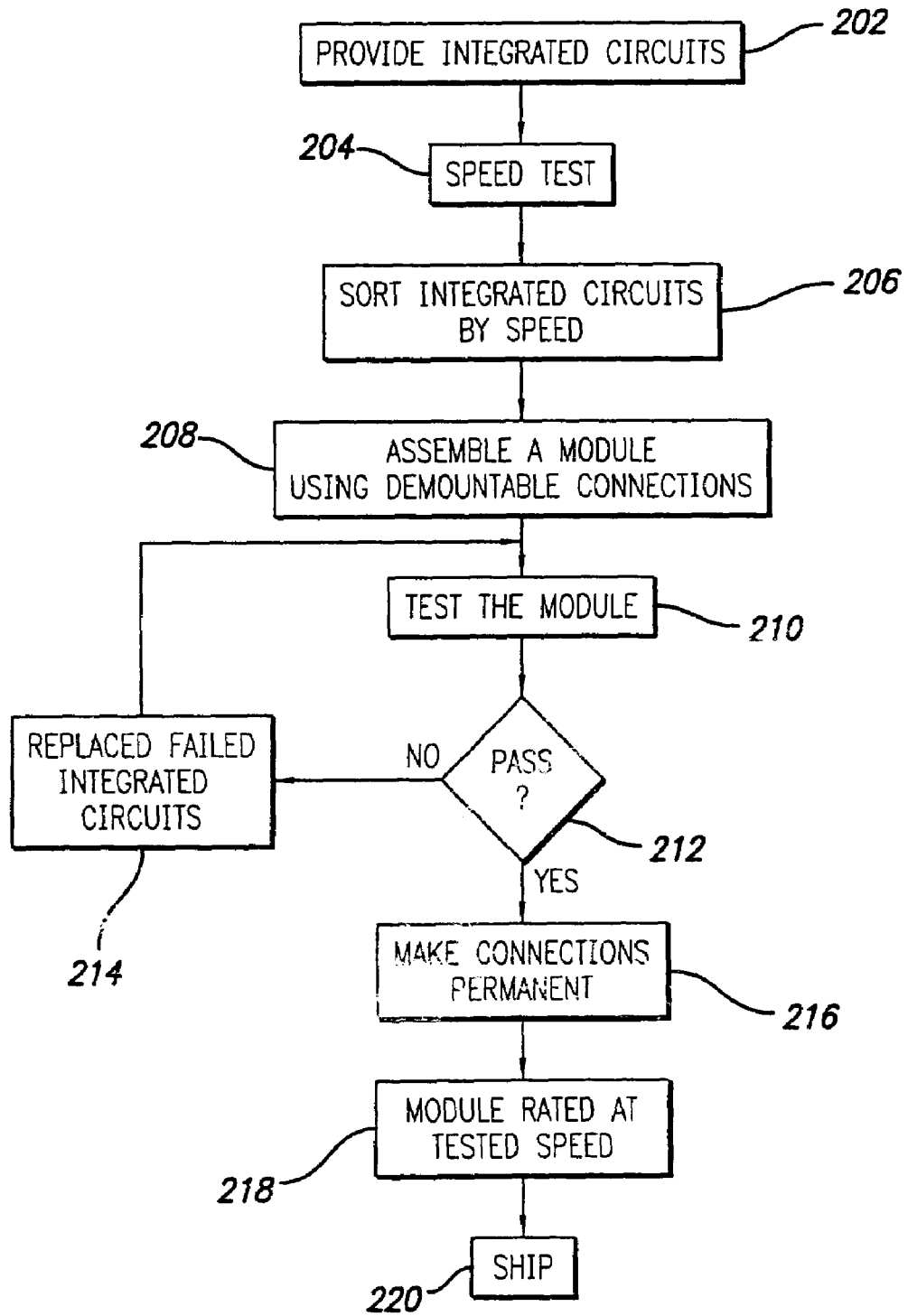
FIG. 2 illustrates a process exemplifying an embodiment of the invention in which a module is assembled and tested.

FIG. 2 shows a process illustrating an exemplary embodiment of the invention. As shown, the exemplary process begins with the acquisition of integrated circuits 202. The integrated circuits are tested to determine their maximum operating speed 204, and the integrated circuits are sorted into groups based on the tested performance of the integrated circuits 206. One method of testing the operating speed of the integrated circuits is temporarily to assemble a module and test the module at a series of operating speeds, and rate and sort the individual integrated circuits accordingly. The integrated circuits may, however, by tested individually or in other ways to determine their operating speed rating.

Once sorted into speed categories, integrated circuits from a particular speed category are demountably assembled to form a module 208. The assembled module is then tested at the particular speed category 210. If the module does not pass 212, the integrated circuit or circuits that failed are removed from the module and replaced with new integrated circuits 214, and the module is again tested 210. If the module passes 212, the connections between the integrated circuits and the substrate may be made permanent at step 216. Then, the module is rated to operate at the tested speed 218, after which it may be sold and shipped to customers 220.

Turning now to a more detailed discussion of each of the steps illustrated in FIG. 2, the types of integrated circuits that may be provided at step 202 are driven by the type of module to be constructed. Nonexclusive examples of the types of integrated circuits that may be provided include microprocessors, memories, digital signal processors, microcontrollers, digital logic circuits, conversion circuits, analog circuits, application specific circuits, etc.

The manner in which the integrated circuits are provided 202 is not critical to the invention, and any process for acquiring integrate circuits may be used. Typically, an integrated circuit is formed as one of many dice on a semiconductor wafer. Once fabricated, initial functionality tests are performed on the wafer, and the wafer is then diced. Dice that passed the functionality tests are packaged and typically subjected to additional testing, including burn-in testing. Again, however, the integrated circuits may be any type of integrated circuit and may be provided by any means. Moreover, the integrated circuits may be packaged or unpackaged.

The manner in which the integrated circuits 204 are speed tested is also not critical to the invention. A variety of equipment and many methods are known to those skilled in the art for determining the best or nearly best operating speed of an integrated circuit, and any such equipment and method may be used. Indeed, as discussed below, this step is optional and not included in alternative embodiments of the invention. It should be noted that the speed testing step 204 may be combined with the step of providing the integrated circuits such that the integrated circuits are provided at step 202 having already been speed tested.

Preferably, the integrated circuits are sorted 206 into and stored in groups (that is, "binned") corresponding to one of several possible operating speed ratings for the module. For example, if electronics modules are to have one of three possible speed ratings—600 megahertz ("MHz"), 700 MHz, or 800 MHz—integrated circuits that test at step 204 at a speed between 600 MHz and 699 MHz would be rated at 600 MHz and stored or "binned" together. Similarly, integrated circuits that test at a speed between 700 MHz and 799 MHz would be rated at 700 MHz and stored together, and integrated circuits that test at a speed of 800 MHz or more would be rated at 800 MHz and stored together. Integrated circuits that test below 600 MHz would be discarded or used elsewhere. This step 206 may also be combined with the step of providing the integrated circuits such that the integrated circuits are provided at step 202 having already been speed tested and sorted into groups by speed. Of course, as the speed testing step 204 is optional, so is the step of sorting the integrated circuits by speed 206.

Preferably, as in the above discussion, the integrated circuits are not down graded to provide a guard band at step 206 but are sorted based on their actual tested speed performance. Alternatively, however, the speed performance of the integrated circuits may be down graded to provide some amount of guard banding. Even if this is done, however, the guard band typically need not to be as large as in prior art methods.

If for example, a guard band of 10 MHz is deemed desirable, integrated circuits testing at a speed between 610 MHz and 709 MHz would be rated at 600 MHz and stored together. Likewise, integrated circuits that test at a speed between 710 MHz and 809 MHz would be rate at 700 MHz and stored together, and integrated circuits that test at a speed of 810 MHz or greater would be rated 800 MHz and stored together. Integrated circuits testing below 610 MHz would be discarded or used else where. Guard bands other than 10 MHz may be used, but as discussed above, in a preferred embodiment, no guard band or a small guard band is used. As mentioned above, steps 204 and 206 may be omitted entirely, and a module initially assembled (step 208 discussed below) without first determining the speed rating of the integrated circuits.

Figure 3:
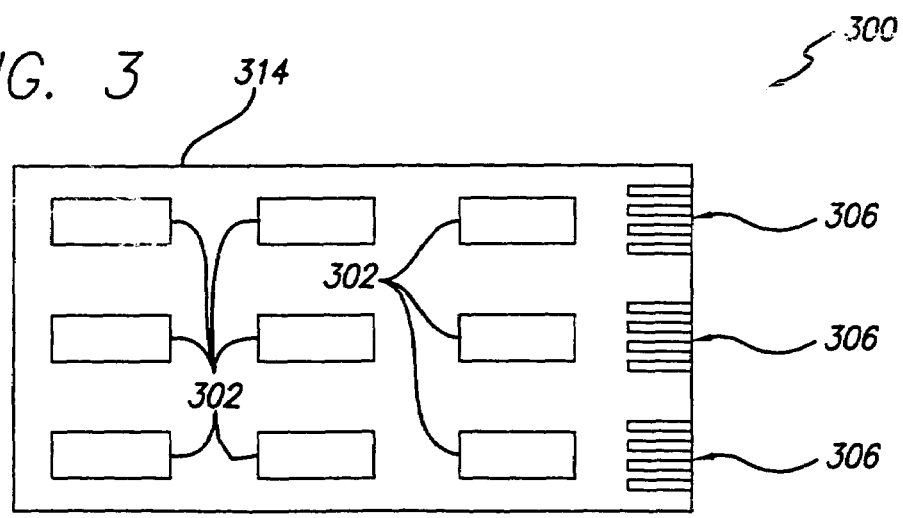
FIG. 3 illustrates an exemplary assembled module.

To assemble a module at step 208, integrated circuits from a particular group (i.e., corresponding to a particular speed rating) are selected and placed on a module substrate, which typically is a module board. For example, as shown in FIG. 3, integrated circuits 302, each rated at 700 MHz (using the above example) during the speed test step 204 are selected from a 700 MHz bin and placed on the module board 314 to form module 300. Of course, if integrated circuits 302 are not all alike (e.g., one is a microprocessor, and the others are memory chips), appropriate integrated circuits must be placed in corresponding locations on the module substrate 314. Many techniques and machines are known for picking selected integrated circuits and placing them onto a module substrate, and any such technique or machine may be used with the invention. For example, a robotic work cell (not shown) may be configured to select appropriate integrated circuits 302 and place them on the module board 314. Selection and configuration of such a robotic work cell is within the skill of those practicing in the field, and any known cell may be used with the invention. Of course, the integrated circuits may be selected and placed on the module board manually or by a combination of automatic and manual means.

It should be noted that integrated circuits 302 may be placed on one or both sides of module board 314. Typically, module board 314 includes electrical connectors 306 for connecting to other module boards or other elements of an overall electronics system.

The integrated circuits 302 are mounted to the module board 314 using readily demountable connections. As will be discussed in more detail below, the use of demountable connections allows integrated circuits 302 that cause the module to fail functional tests at the rated speed to be easily removed and replaced with new integrated circuits.

Generally speaking, a connection between an integrated circuit 302 and the module substrate 314 includes a contactor located on an input/output terminal of the integrated circuit and a corresponding contactor located on the module substrate. A preferred connection includes a conductive, elongate contact, which may be a spring contact, fixedly secured to the input/output terminal on an integrated circuit 302 and a corresponding socket formed on or in the module board 314.

Figure 4A:
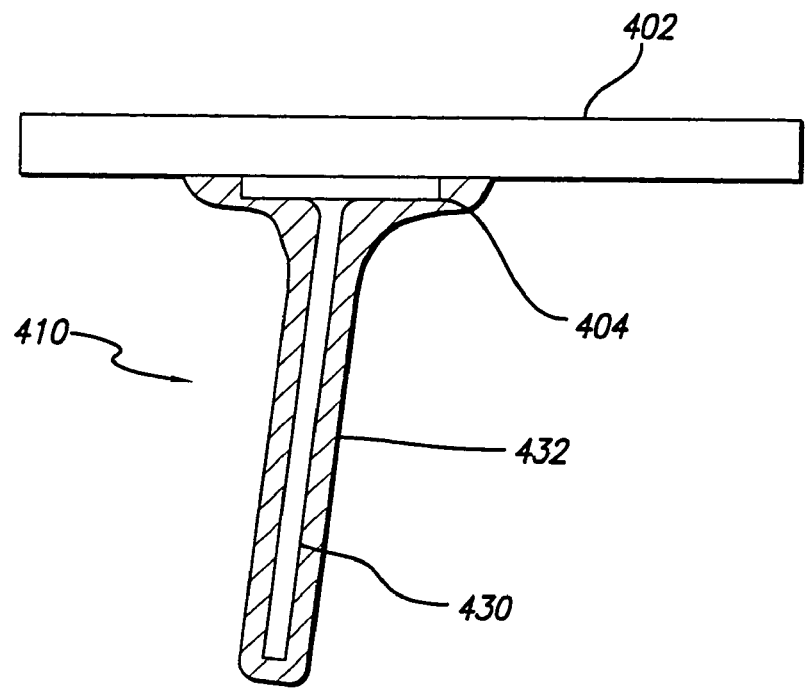
FIGS. 4A and 4B illustrate exemplary conductive spring contacts.
Figure 4B:
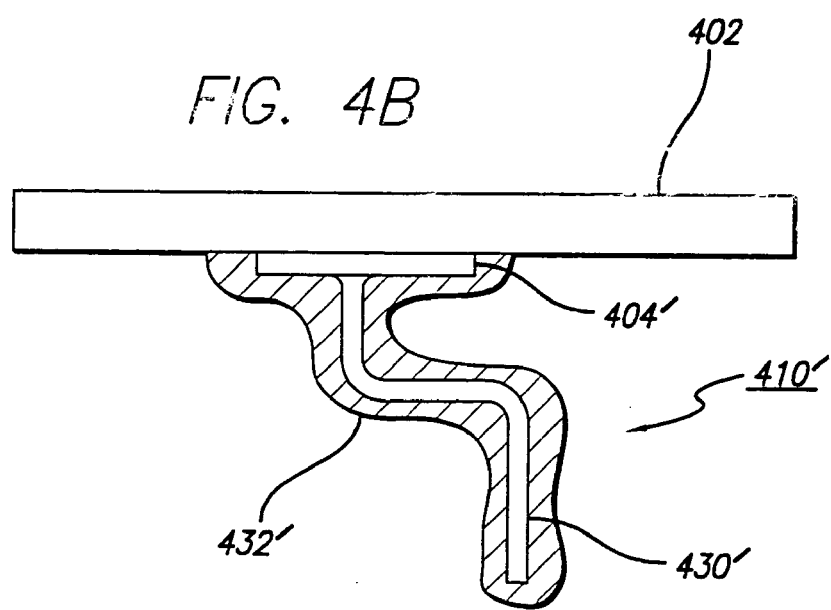

FIG. 4A illustrates a cross-sectional view of an exemplary elongate, resilient interconnect element 410 that may be used with the present invention. The interconnect element 410 comprises a wire core 430 that is wire bonded to terminal 404 on substrate 402 (e.g., an integrated circuit). Standard wire bonding techniques may be used. The wire core 430 is preferably made of a soft, readily shapeable material. Depending on the material selected, the wire core 430 may be formed into just about any shape. A soft, readily shapeable material, however, is usually not particularly strong or resilient. To make the structure strong and/or resilient, a coating 432 is formed over the wire core 430. The coating 432 is preferably made of a material that is stronger, harder and/or more resilient than the wire core 430. If this is the case, the coating 432 imparts strength, hardness, and/or resiliency to the interconnect element 410. By using a combination of a soft, readily shapeable material for the wire core 430 and a stronger, more resilient material for the coating 432, strong, resilient interconnect structures 410 may be formed in practically any shape. Thus, the shape illustrated in FIG. 4A is exemplary only. For example, elongate shapes with one or more changes in direction, bends, zigs, zags, etc. in any direction (e.g., the "x,","y," and/or "z" directions with respect to FIG. 4A) can be formed. FIG. 4B illustrates an exemplary, shape having two bends or changes of direction.

Although the interconnect element 410 illustrated in FIGS. 4A and 4B consists of two materials (a wire core 430 and a coating 432), additional materials may be included in the composition of the interconnect element. For example, one or more additional coatings of materials may be included between the wire core 430 and the coating 432. Likewise, one or more coatings of other materials may be formed over coating 432. In addition, additives may optionally be added to one or more of the materials that comprise the interconnect structure 410, and the interconnect structure may be heat treated to improve or manipulate physical and mechanical properties of the structure. Exemplary additives and heat treatment are described in U.S. Pat. No. 6,150,186, which is incorporated herein by reference in its entirety. Many variations of the interconnect element illustrated in FIGS. 4A and 4B, including shapes, structures, and manufacturing processes are described in detail in U.S. Pat. No. 5,476,211, U.S. Pat. No. 5,917,707, and U.S. application Ser. No. 08/452,255, filed May 26, 1995, all of which are incorporated herein by reference in their entirety.

Figure 5A:
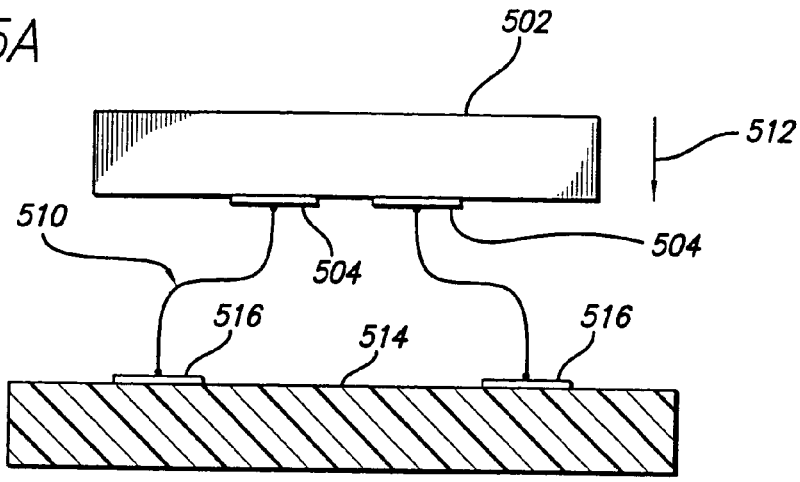
FIG. 5A illustrates an exemplary temporary interconnection between an integrated circuit and a module board.

FIG. 5A illustrates an integrated circuit 502 with a plurality of input/output terminals 504 (two are shown) to which are secured a plurality of spring contacts 510 (two are shown). The spring contacts 510 may be multilayer spring contacts as illustrated in FIGS. 4A and 4B. Alternatively, spring contacts 510 may be formed from a single layer of springy material rather than being multilayer as shown in FIGS. 4A and 4B. In addition, and as discussed below in connection with FIGS. 14A through 16, spring contacts 510 may be lithographically formed, elongate spring contacts. Moreover, the spring contacts 510 may be replaced with nonspring contacts that are nevertheless elongate such that they extend away from the integrated circuit sufficiently to make contact with contact locations or sockets (e.g., pads, recesses, vias, holes, terminals, etc.) in the module board. Metallized polymer bumps and filled conductive polymer protrusions are two nonexclusive examples of such contacts. (All such contacts protruding from input/output pads on the integrated circuit are referred to herein as "protruding contacts","elongate contacts" or "elongate interconnection elements.")

Module board 514 includes a plurality of contact pads 516 (two are shown) for making electrical contact with the spring contacts 510. In step 208 of FIG. 2, an integrated circuit, such as the one 502 illustrated in FIG. 5A, may be demountably assembled to the module board 514 by bringing the integrated circuit into contact with the module board and applying a temporary force 512 to the integrated circuit 502 directed generally toward the module board 514 as shown in FIG. 5A. The integrated circuit 502 is readily removed from the module board 514 by simply removing the temporary force 512, and moving the integrated circuit away form the module board. The temporary force 512 may be applied by a robotic work cell, which may also be configured to remove the integrated circuit 502 from the module board 514. Of course, the force may be applied and the integrated circuit removed manually or by a combination of automatic and manual means.

Figure 5B:
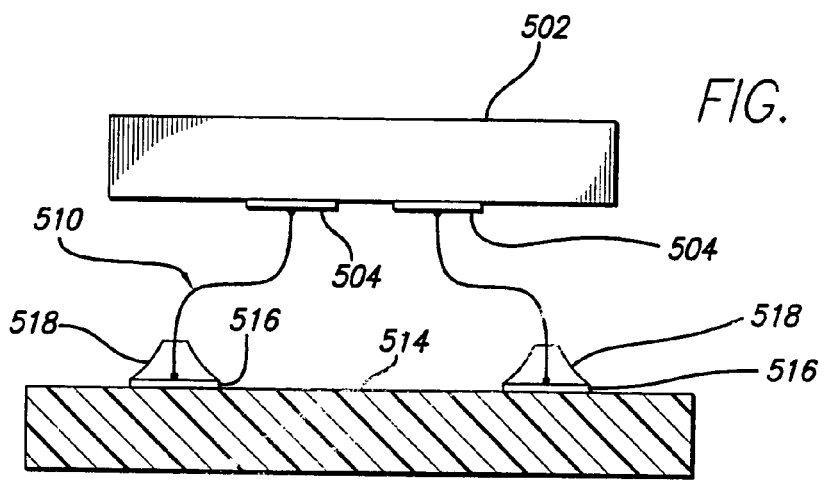
FIG. 5B illustrates use of solder to make the interconnection of FIG. 5A permanent.
Figure 5C:
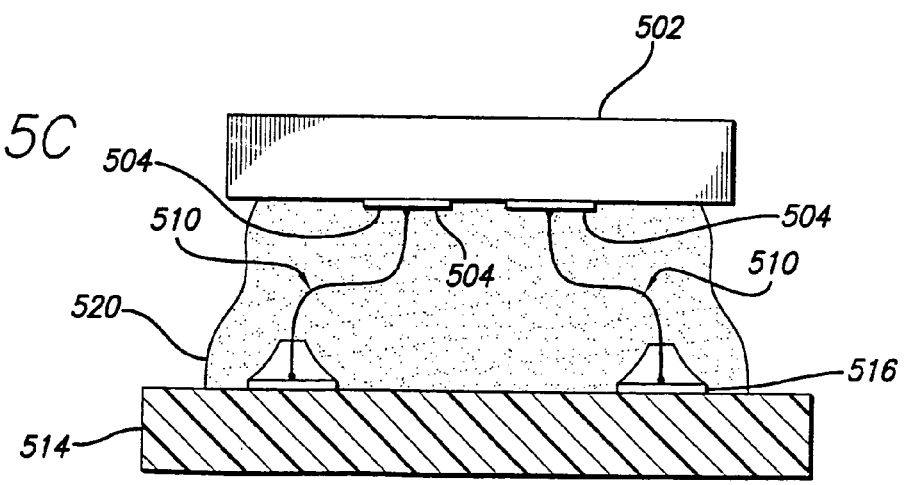
FIG. 5C illustrates use of an adhesive to make the interconnection of FIG. 5A permanent.

As will be discussed in more detail below, FIGS. 5B and 5C illustrate two exemplary ways to make the assembly permanent at step 216 after the module has passed tests at a given operating speed. The spring contacts 510 may be soldered 518 to the terminals 516 (see FIG. 5B), or an adhesive 520 may be applied between the integrated circuit 502 and the module board 514 (see FIG. 5C).

Figure 5D:
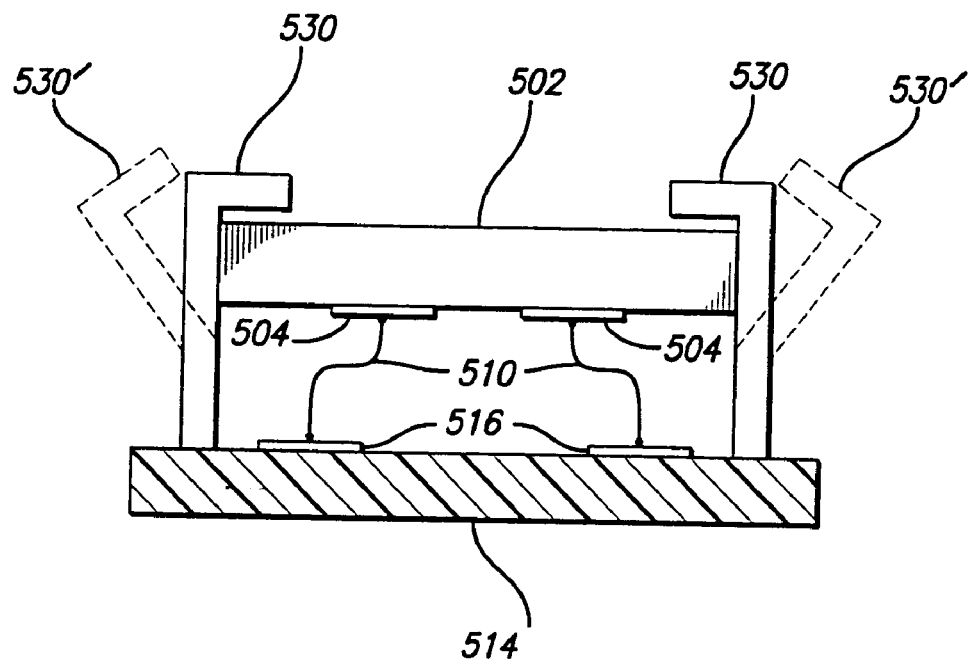
FIG. 5D illustrates use of clips to make an exemplary interconnection between an integrated circuit and a module board.

FIG. 5D illustrates use of clips 530 to secure the integrated circuit 502 to the module board 514 at step 208 in FIG. 2. As shown, clips 530 are attached to the module board 514 and are flexible. To assembly a module 208, clips are moved to position 530', allowing an integrated circuit 502 to be brought into contact with module board 514. Integrated circuit 502 is readily removed from the module board by simply moving the clips into position 530' and moving the integrated circuit away from the module board.

Figure 6:
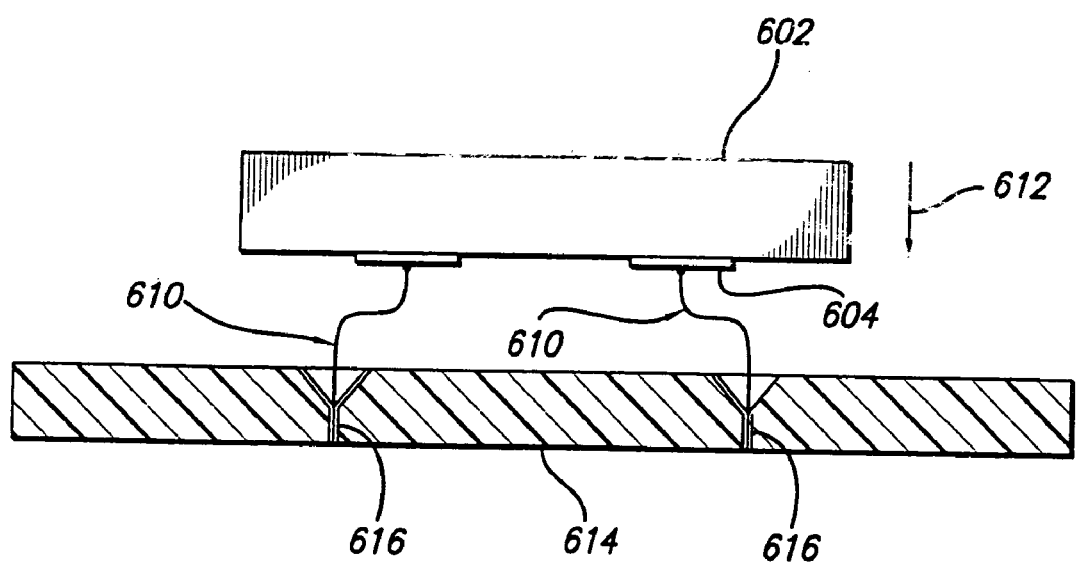
FIG. 6 illustrates an exemplary interconnection between an integrated circuit and a module board.
Figure 7:
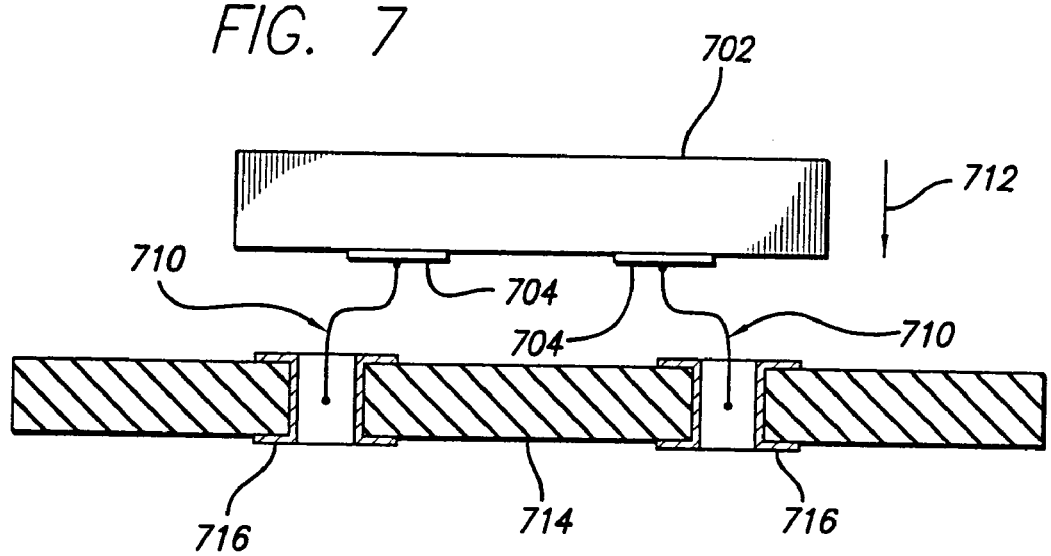
FIG. 7 illustrates an exemplary interconnection between an integrated circuit and a module board.

FIGS. 6 and 7 illustrate exemplary variations of FIG. 5A. As shown in FIG. 6, spring contacts 610 on integrated circuit 602 are brought into contact with conductive recesses 616 on module board 614. It should be noted that recesses 616 may be any shape, including without limitation semicircular, square, and rectangular. In FIG. 7, spring contacts 710 on integrated circuit 702 are received in conductive vias 716 on module board 714. As with FIG. 6 above, during the testing step 210 in FIG. 2, a temporary force 612, 712 holds the integrated circuit 602, 702 to module board 614, 714.

Figure 8:
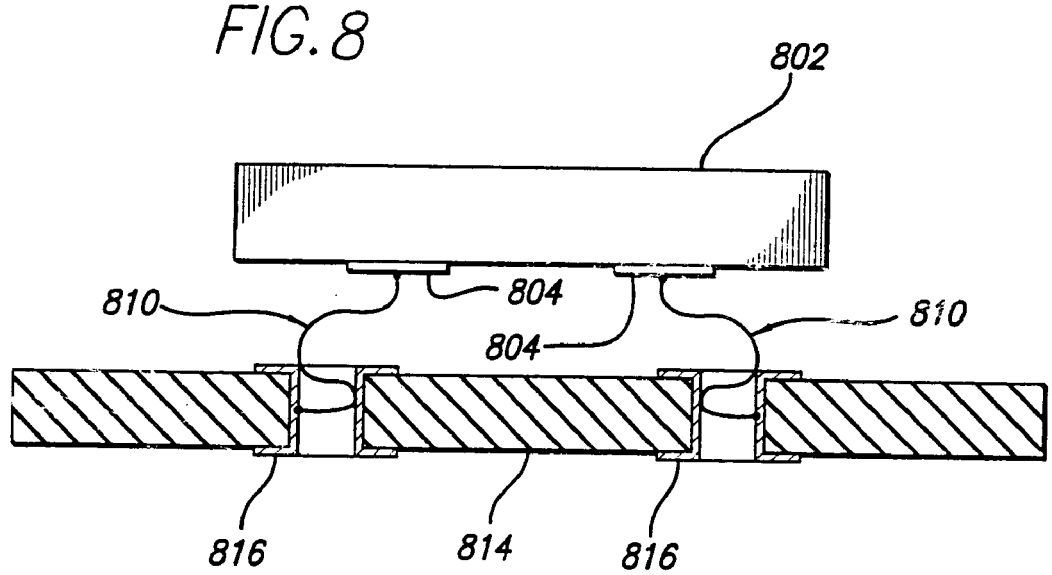
FIG. 8 illustrates an exemplary interconnection between an integrated circuit and a module board.

FIG. 8 illustrates another exemplary way of making a demountable connection between an integrated circuit and a module board. As shown, spring contacts 810 (which are secured to input/output terminals 804 on the integrated circuit 802) are shaped such that, while inserted into conductive alias 816 in module board 814, the spring contacts 810 engage the sides of the vias 816 with sufficient force to securely hold the integrated circuit 802 to the module board 814 without the need for an outside force, such as forces 512, 612, and 712 illustrated in FIGS. 5A, 6, and 7. In this sense, the connection is permanent. If, however, sufficient force is applied to the integrated circuit 802 in a direction away from the module board 814, the springs 810 readily disengage from the vias 816, freeing the integrated circuit from the module board. In this sense, the connection is demountable.

Figure 9:
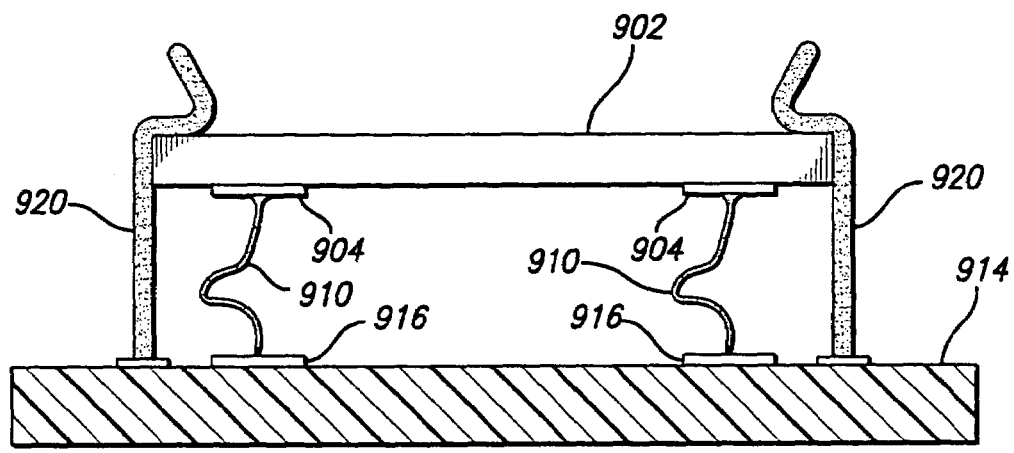
FIG. 9 illustrates an exemplary interconnection between an integrated circuit and a module board.

FIG. 9 illustrates another exemplary method of making a demountable connection. As with the integrated circuits discussed above, integrated circuit 902 includes a plurality of input/output terminals 904 (two are shown) to which are secured a plurality of spring contacts 910 (two are shown). Also like the module board 514 discussed above, module board 914 includes a plurality of pads or terminals 916 for making electrical contact with one of the plurality of spring contacts 910. Alternatively, the pads or terminals 916 may be recesses, holes, or vias, such as illustrated in FIGS. 6 and 7 and discussed above. (All such pads, recesses, holes, vias, terminals, etc. being referred to generally as "sockets" or "contact locations.")

As illustrated in FIG. 9, however, module board 914 also includes a plurality of spring clips 920 (two are shown) for securing the integrated circuit 902 to the module board 914. The spring clips 920 may be made of a readily flexible inner core that is coated with a resilient material like the spring contacts illustrated in FIGS. 4A and 4B. Because the spring clips 920 are flexible, they readily bend to the left and right in FIG. 9, allowing the integrated circuit 902 to be moved into contact with the module board 914 as shown in FIG. 9 or moved away from the module board. Because the spring clips 920 are resilient, however, they naturally return to the positions shown in FIG. 9. Spring clips 920 thus hold integrated circuit 902 in place against module board 914, but spring clips 920 are easily moved to the left and right, respectively, in FIG. 9, allowing for easy removal (or demounting) of the integrated circuit 902 from the module board 914.

Figure 10:
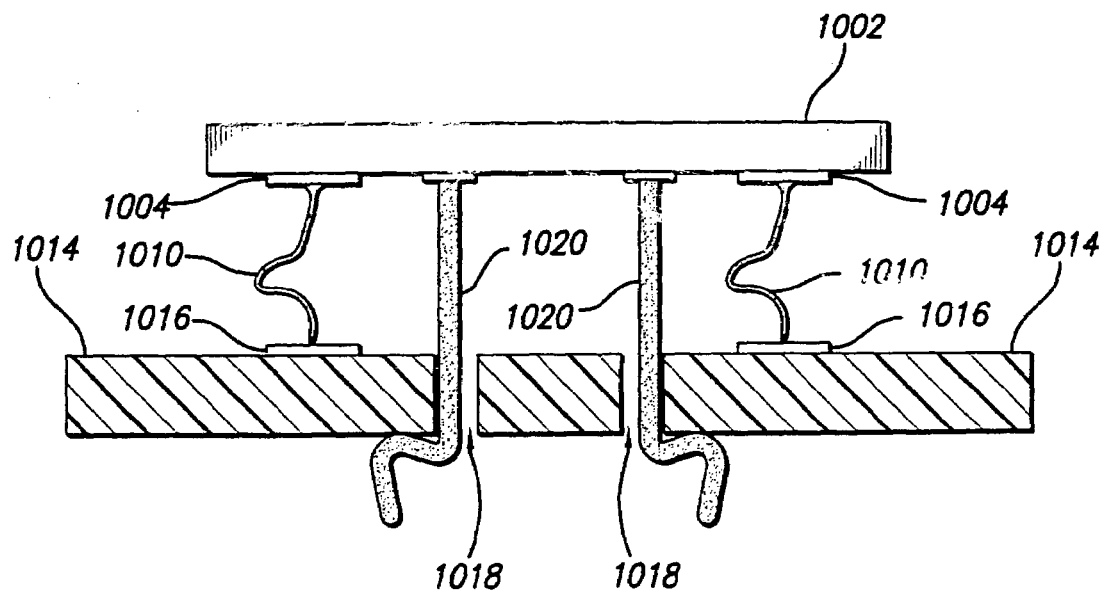
FIG. 10 illustrates an exemplary interconnection between an integrated circuit and a module board.

FIG. 10 illustrates a variation of the configuration of FIG. 9. In FIG. 10, clip springs 1020 are formed on integrated circuit 1002. While clip springs 1020 are engaged as shown in FIG. 10, clip springs 1020 hold the integrated circuit 1002 to the module board 1014. Holes 1018 in module board 1014 allow clip springs 1020 to be removed from the module board, 1014, allowing the integrated circuit 1002 to be removed from the, module board 1014.

Figure 11A:
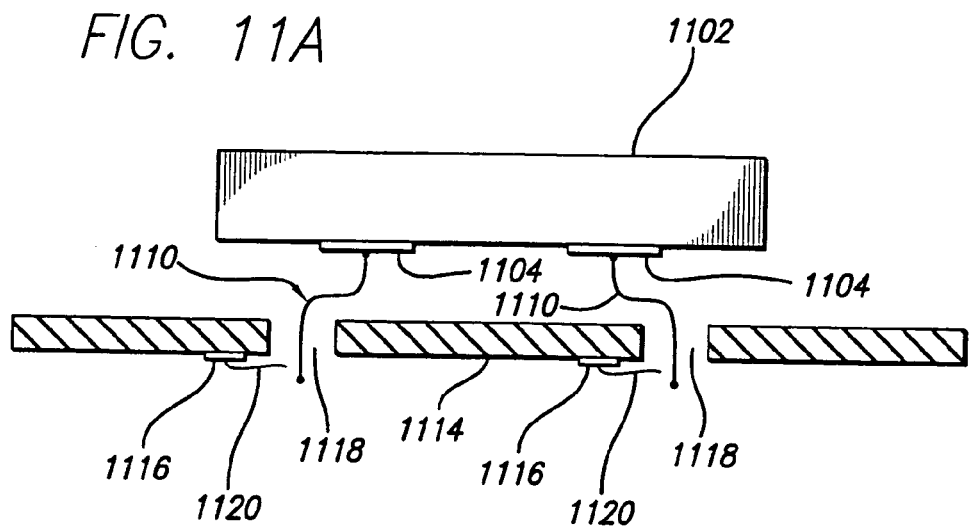
FIG. 11A–11D illustrate an exemplary interconnection between an integrated circuit and a module board.
Figure 11B:
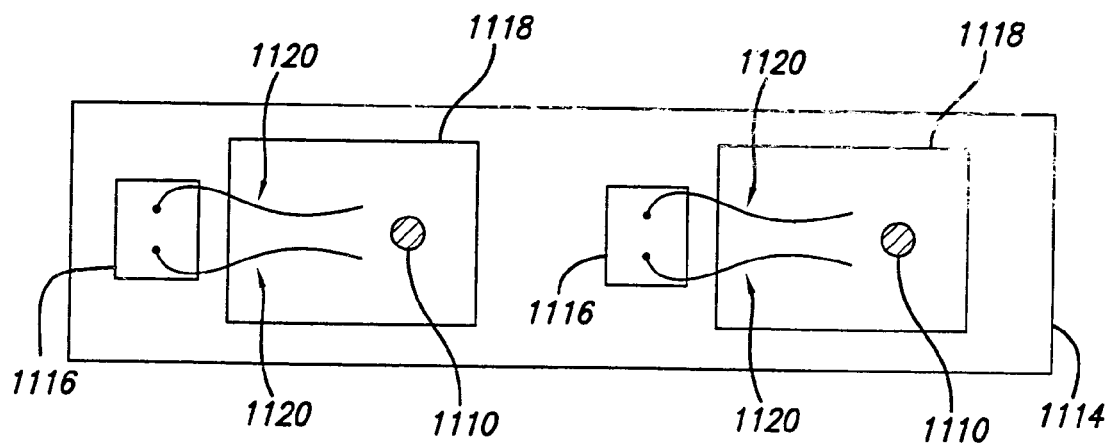
Figure 11C:
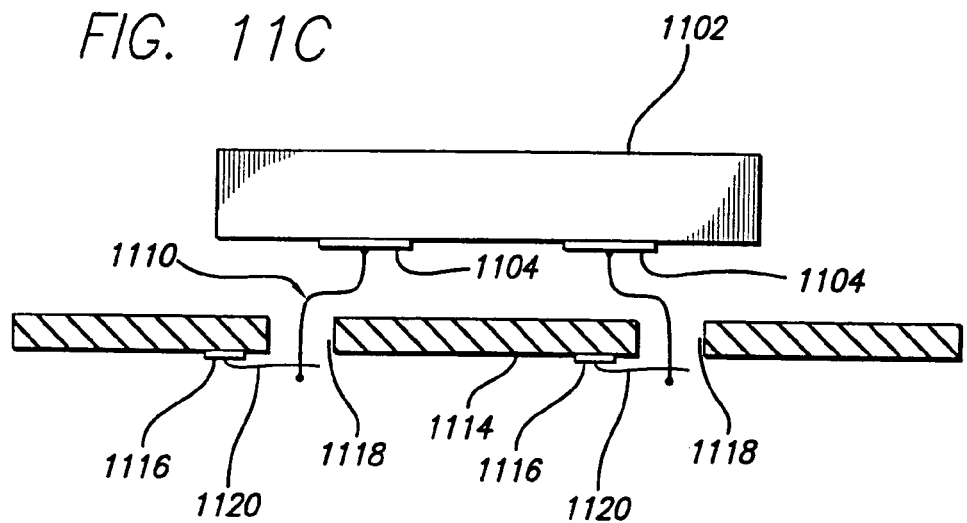
Figure 11D:
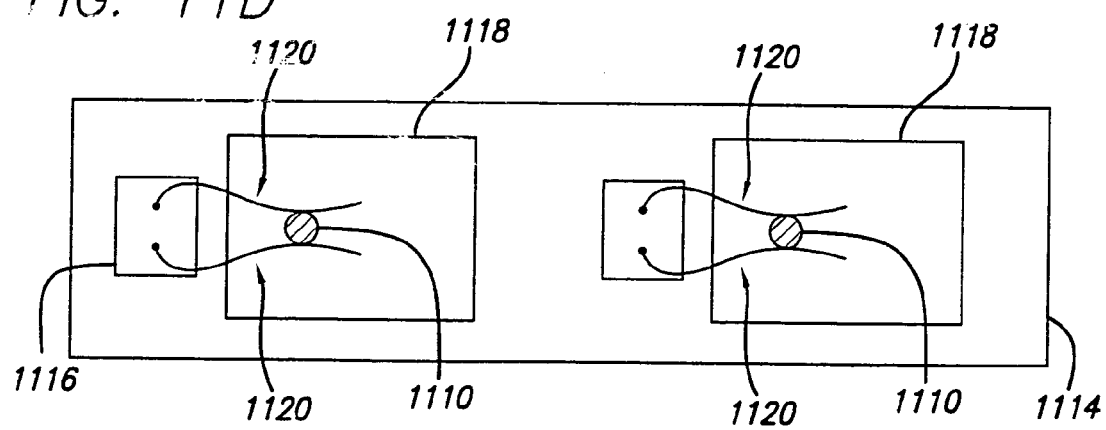

FIGS. 11A–11D illustrate yet another example of making a permanent connection to the module board that is nevertheless readily demountable. As shown in FIG. 11A, an integrated circuit 1102 includes a plurality of input/output terminals 1104 (two are shown) to which are secured a plurality of spring contacts 1110 (two are shown). The module board 1114 includes electrical terminals 1116 to which are secured electrically conductive clips 1120. The spring contacts 1110 on the integrated circuit 1102 are initially inserted vertically (from the perspective of FIG. 11A) through holes 1118 in module board 1114 as shown in FIG. 11A. (FIG. 11B shows a bottom view of FIG. 11A.) Once the spring contacts 1110 are inserted as shown in FIGS. 11A and 11B, the integrated circuit 1102 is moved horizontally (to the left in FIGS. 11A and 11B) to engage clips 1116, as shown in FIG. 11C. (FIG. 11D shows a bottom view of FIG. 11C.) Clips 1120, which may be formed like the spring contacts illustrated in FIGS. 4A and 4B, secure the integrated circuit 1102 to the module board 1114. The integrated circuit 1102 may be demounted from the module board 1114 by following the above described steps in reverse order.

Figure 12A:
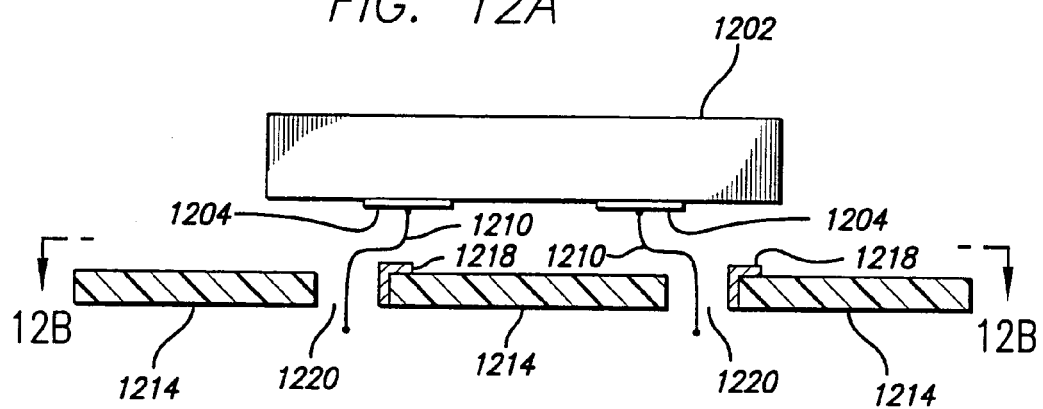
FIGS. 12A–12D illustrate an exemplary interconnection between an integrated circuit and a module board.
Figure 12B:
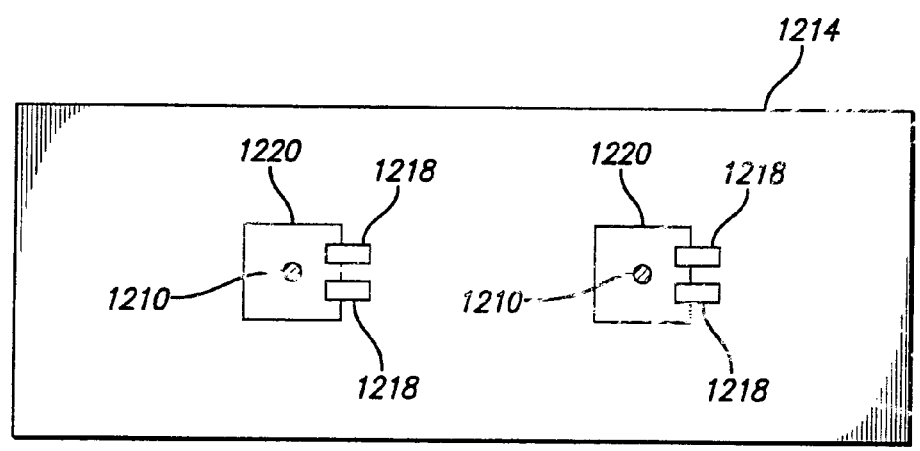
Figure 12C:
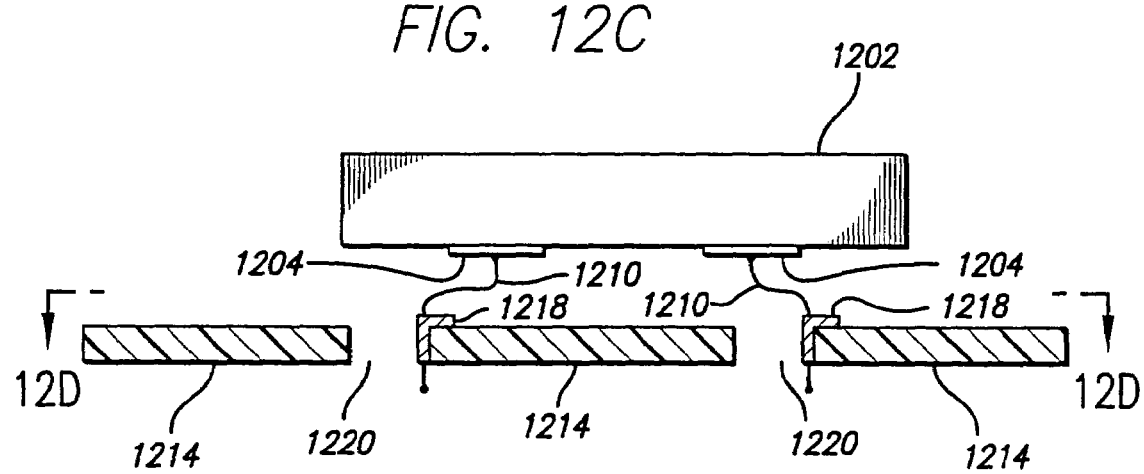
Figure 12D:
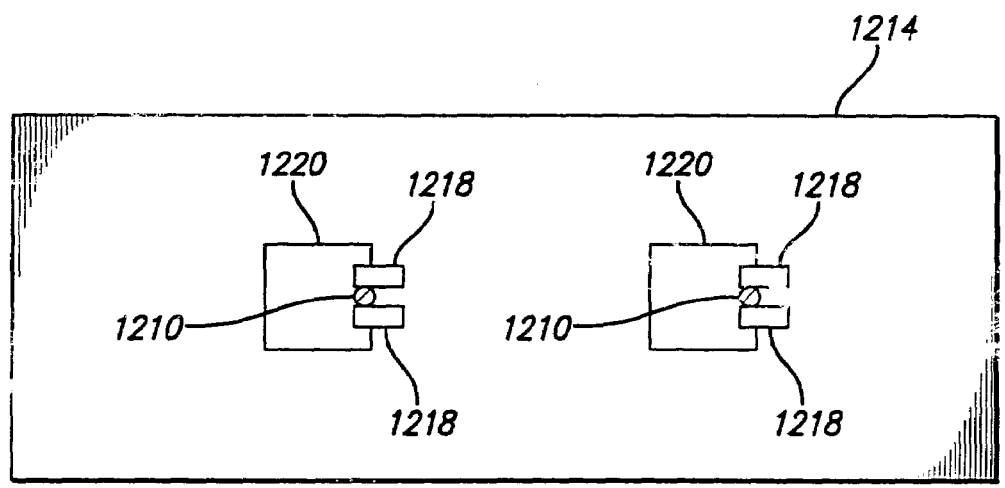

FIGS. 12A–12D illustrate still another example of making a permanent connection to the module board that is nevertheless readily demountable. As shown in FIG. 12A, an integrated circuit 1202 includes a plurality of input/output terminals 1204 (two are shown) to which are secured a plurality of spring contacts 1210 (two are shown). As shown in FIGS. 12A and 12B (which shows a bottom view of FIG. 12A), module board 1214 includes vias 1220 (two are shown) in which are formed protrusions 1218. At least one of the vias 1220 or the protrusions 1218 are electrically conductive. An integrated circuit 1202 is secured to the module board 1214 by inserting a spring contact 1210 vertically (from the perspective of FIG. 12A) through a via 1220 as shown in FIGS. 12A and 12B and then moving the integrated circuit 1202 horizontally (from the perspective. of FIG. 12A) such that the spring contact 1210 is wedged between protrusions 1218 as shown in FIGS. 12C and 12D. (FIG. 12D shows a bottom view of FIG. 12C.) The integrated circuit 1202 is easily demounted from the module board 1214 by following these steps in reverse order.

Figure 13A:
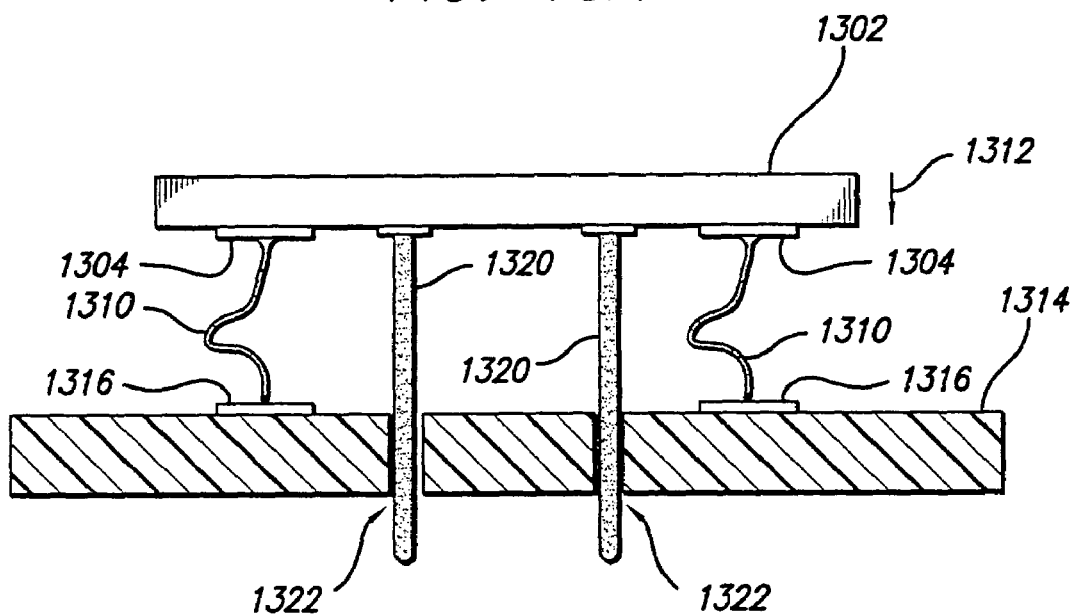
FIG. 13A illustrates an exemplary temporary interconnection between an integrated circuit and a module board.
Figure 13B:
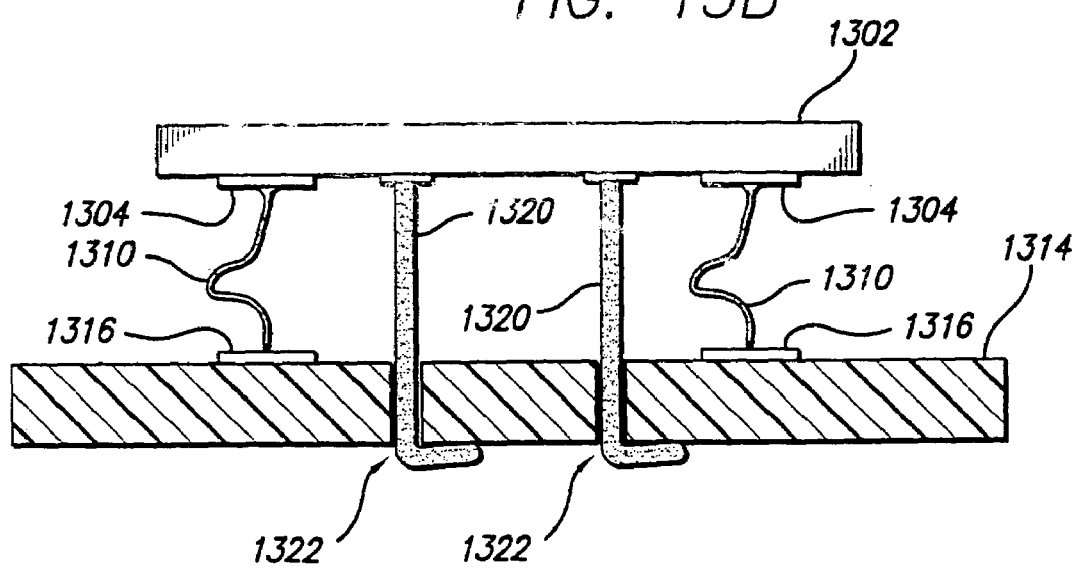
FIG. 13B illustrates the interconnection of FIG. 13A made permanent.

FIG. 13A illustrates yet another way of demountably assembling an integrated circuit 1302 to a module board 1314 that may be used in step 208 of FIG. 2. As with other integrated circuits described above, integrated circuit 1302 includes a plurality of input/output terminals 1304 (two are shown) to which are secured a plurality of spring contacts 1310 (two are shown). As with other module boards described above, module board 1314 includes a plurality of sockets 1316 (which may be pads, recesses, holes, or vias as described above) for electrically engaging the spring contacts 1310. The integrated circuit 1302 illustrated in FIG. 13A further includes a plurality of guide pins 1320, and the module board 1314 includes corresponding guide holes 1322 into which the guide pings 1320 fit. As shown in FIG. 13A, the integrated circuit 1302 is temporarily mounted to the module board 1314 by inserting guide pins 1320 into guide holes 1322 and applying a downward force 1312 on the integrated circuit 1302 towards the module board 1314. As illustrated in FIG. 13B and discussed below with respect to step 216 of FIG. 2, the mounting can be made permanent by bending the ends of guide pins 1320 that pass through guide holes 1322 as shown in FIG. 13B.

Further examples and descriptions of sockets that may be used with the present invention may be found in the above-mentioned U.S. Pat. Nos. 5,476,211, 5,917,707, and 6,110, 823. The following also illustrate sockets and are also incorporated herein in there entirety by reference: U.S. Pat. No. 5,772,451; U.S. Pat. No. 6,033,935; and U.S. patent application Ser. No. 08/452,255, filed May 26, 1995.

Figure 14A:
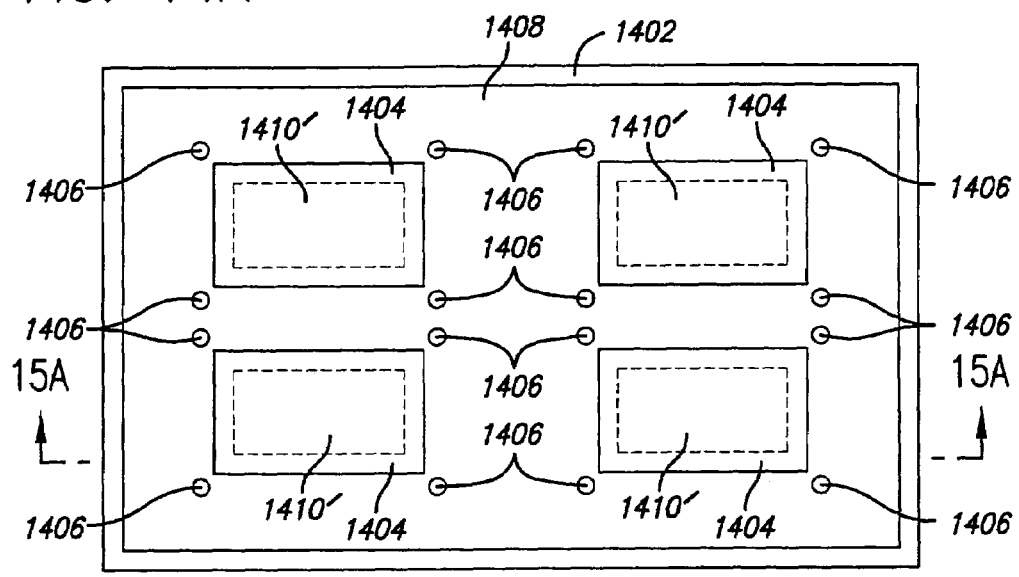
FIGS. 14A–14C illustrate an exemplary mounting of integrated circuits on a module substrate.

FIGS. 14A–15C illustrate yet another exemplary manner in which integrated circuits may be demountably secured to a module board. FIGS. 14A and 15A (FIG. 15A is a cross-sectional side view of FIG. 14A) shows a module board 1402 on which has been deposited a die edge registration fixture (commonly referred to as a "DERF") 1408. Generally speaking, the primary purpose of a DERF is to provide a structure for generally guiding integrated circuits into an approximately correct position on the module board. To that end, the exemplary DERF 1408 illustrated in FIGS. 14A and 15A include openings 1404 that generally correspond to the locations 1410' at which integrated circuits are to be placed on the module board 1402. (These integrated circuit locations 1410' are illustrated in dashed lines in FIG. 14A.) Of course many variations on the DERF are possible. For example, it need not consist of one contiguous material as shown in FIG. 14A. Rather, the DERF may consist of any pattern that forms general guides around the integrated circuit locations 1410'. Generally speaking, the DERF 1408 may be made of may different materials. In one example, the DERF may comprise a solder mask formed on the module board 1402. Through holes 1406 are provided through the DERF 1408 and the module board 1402.

Figure 14B:
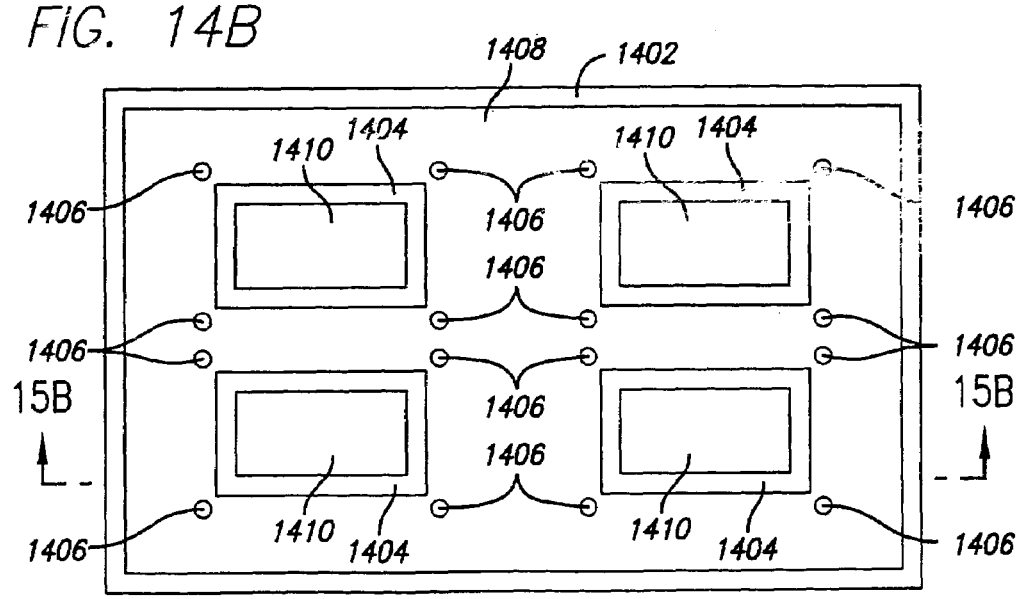

As shown in FIGS. 14B and 14B (FIG. 15B is a cross-sectional side view of FIG. 14B), integrated circuits 1410 are placed onto the module board 1402. As mentioned above, the openings 1404 in the DERF 1408 help guide the integrated circuits 1410 into a generally correct position on the module board 1402. The use of DERFs may allow for the use of less precise (and therefore less expensive) equipment for assembling the modules.

Figure 14C:
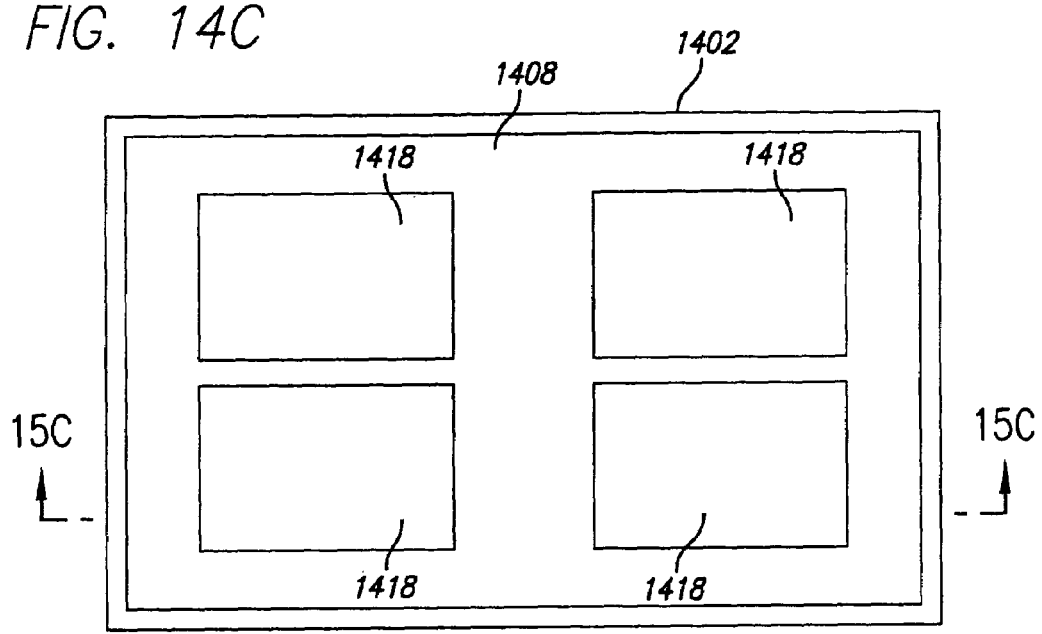

As shown in FIGS. 14C and 15C (FIG. 15C is a cross-sectional side view of FIG. 14C), legs 1412 of a frame 1418 are inserted though holes 1406. The frame is preferably formed of sheet metal and/or wires, but may be formed of other materials as well. The frame 1418 includes a retaining spring 1416 that holds an integrated circuit 1410 in place against the module board 1402. The ends of the legs 1412 form clips 1414 that secure the frame 1418 to the module board 1402. The clips 1414 may be formed in a number of ways. For example, the clips 1414 may be spring loaded such that they collapse as they are being inserted through holes 1406 and expand after exiting the holes. As another example, legs 1412 may be initially straight. The ends of the legs 1412 may be bent to form clips 1414 after the legs are inserted through holes 1406. Frame 1418 may be removed from the module board 1402, if necessary, in any of a number of ways. For example, a tool may be used to straighten the clip 1414 sufficiently to allow the legs 1412 to be removed from holes 1406. As another example, clips 1414 may simply be cut from legs 1412, allowing the legs to be removed from the holes 1406.

It should be noted that a stop structure or stop structures (not shown) may optionally be secured to the integrated circuit 502, 602, 702, 802, 902, 1002, 1102, 1202, 1302, 1410 illustrated in FIGS. 5A, 6, 7, 8, 9, 10, 11, 12A, 13A, and 14A–15C to prevent the integrated circuit from moving closer than the height of the stop structure to the module board 514, 614, 714, 814, 914, 1014, 1114, 1214, 1314, or 1402. Alternatively, the stop structure or stop structures may be secured to the module board, or secured to both the integrated circuit and the module board.

It should also be noted that, although spring contacts such as those illustrated in FIGS. 4A and 4B are shown in each of the exemplary connection schemes shown in FIGS. 5A through 15C, the invention is not limited to the use of such spring contacts.

FIGS. 16A–18D illustrate contact springs that are made lithographically rather than by a wire bonding technique illustrated in FIGS. 4A and 4B. Such spring contacts are made using lithographic techniques similar to techniques used for making integrated circuits. That is, one or more masking layers are used to create a pattern in which elements of the spring contact are formed.

Figure 16A:
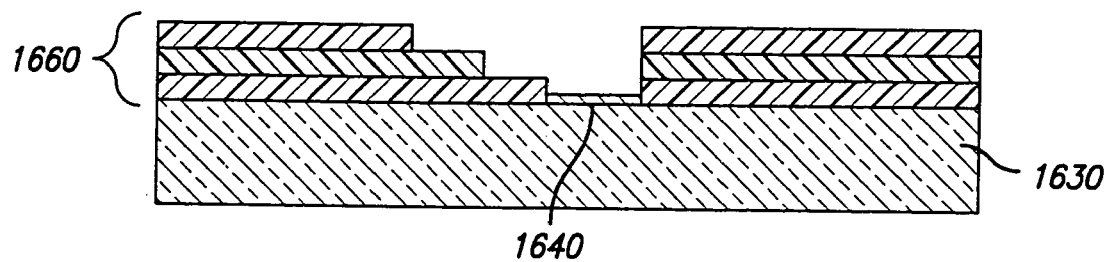
Figure 16B:
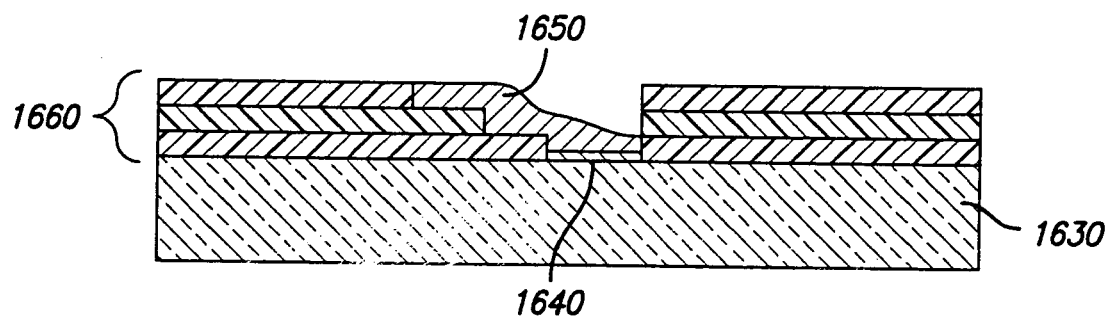
Figure 16C:
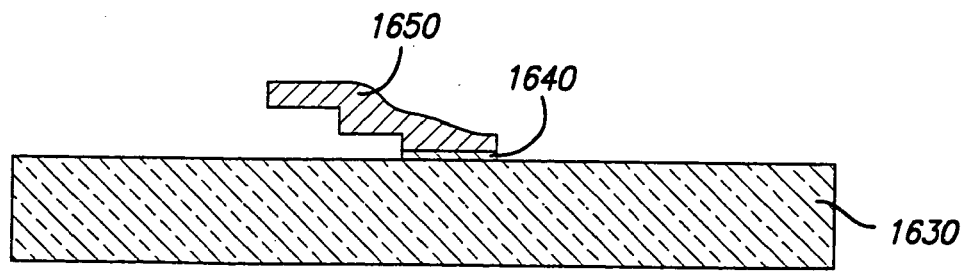

FIGS. 16A–18D illustrate exemplary lithographic processes for forming elongate, resilient interconnect elements that may be used with the present invention. In FIG. 16A, one or more layers of masking materials 1660 are formed on integrated circuit 1630. The masking layers 1660 define both an opening exposing a terminal 1640 and a shape for an elongate, resilient interconnect element 1650 that is to be formed on the terminal. Once the masking layers 1660 are formed on the integrated circuit 1640, material is deposited on the masking layers 1660, forming interconnect element 1650 on terminal 1640 as shown in FIG. 16B. Thereafter, masking layers 1660 are removed, leaving elongate interconnect element 1650 attached to terminal 1640, as shown in FIG. 16C.

Standard lithographic techniques known to those in the semiconductor field may be used to form the masking layers 1660 on the integrated circuit 1630. The material deposited on the masking layers 1660 may be a single, springy material. Alternatively, multiple depositions of different materials may be made on the masking layers 1660 so that the interconnect element 1650 is ultimately made of multiple layers of different materials. Moreover, the interconnect element 1650 may be further processed after masking layers 1460 are removed from the integrated circuit 1630. For example, the initial material deposited in the masking layers 1660 may be a soft, readily shapeable material such as forms the inner core of the interconnect element 1650 illustrated in FIGS. 4A and 4B. That material may then be coated, for example, after the masking layers 1660 are removed, with a strong, resilient material as described above with regard to FIGS. 4A and 4B. As another example, the interconnect element 410 may be heat treated, for example, as described above with respect to FIGS. 4A and 4B.

Figure 17A:
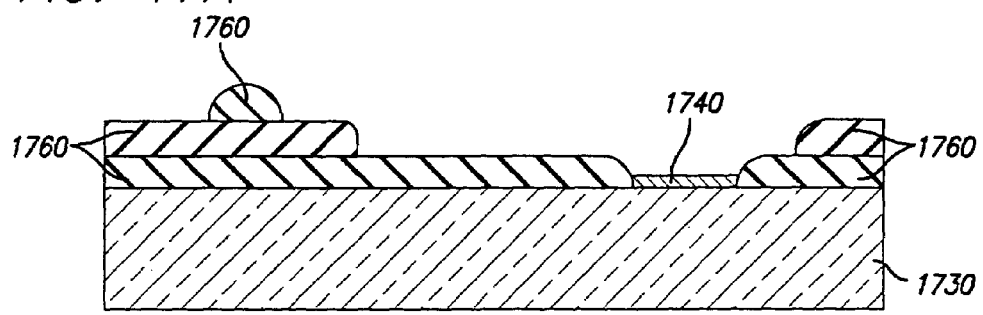
Figure 17B:
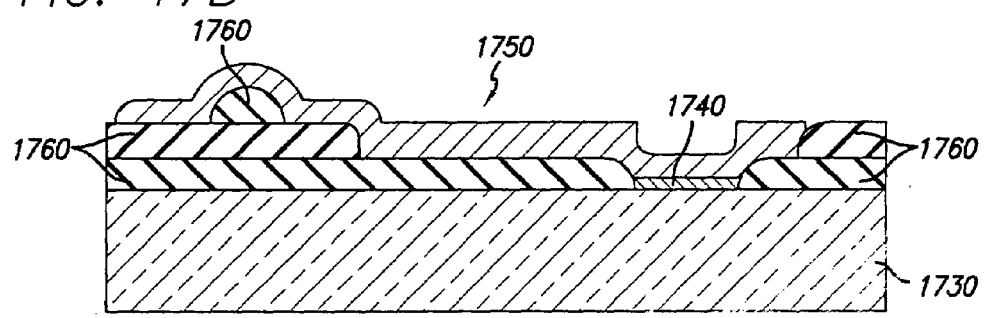
Figure 17C:
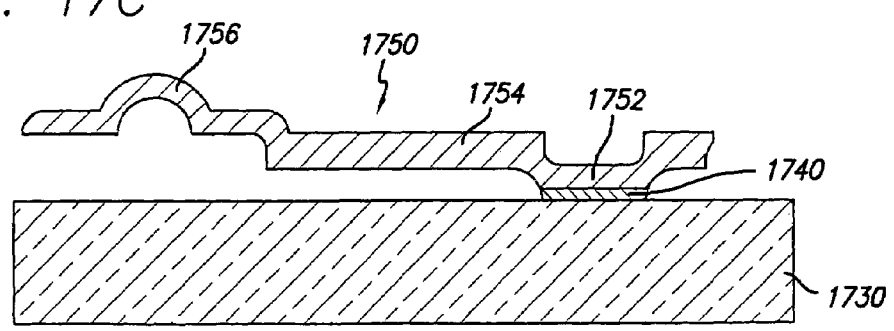

As should be apparent, the shapes and configurations of interconnection elements formed lithographically are almost limitless. By appropriately forming the masking layers 1660, interconnection elements 1650 having just about any contour, bend, change in direction, zig, zag, etc. in any location or direction (e.g., in any of the "x," "y," and/or "z" directions with respect to FIGS. 16A–16C) may be formed. FIGS. 17A–17C illustrate a nonexclusive example of a interconnect element 1750 formed to have a base portion 1752 attached to a terminal 1740 on a integrated circuit 1730, a beam portion 1754, and a contact portion 1756. As shown in FIGS. 17A and 17B, masking layers 1760 form a pattern into which one or more materials are deposited to form the interconnect element 1750. Removing masking layers 1760 leaves interconnect element 1750 attached to terminal 1740 on integrated circuit 1730, as shown in FIG. 17C.

Figure 18A:
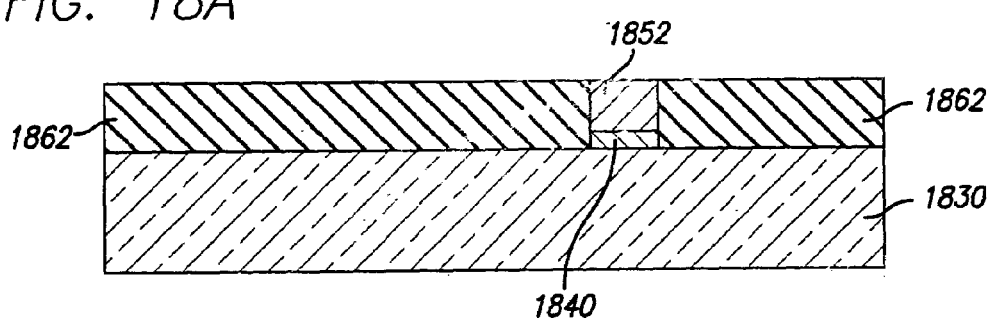
FIGS. 16A–18D illustrate exemplary lithographically formed conductive spring contacts.
Figure 18B:
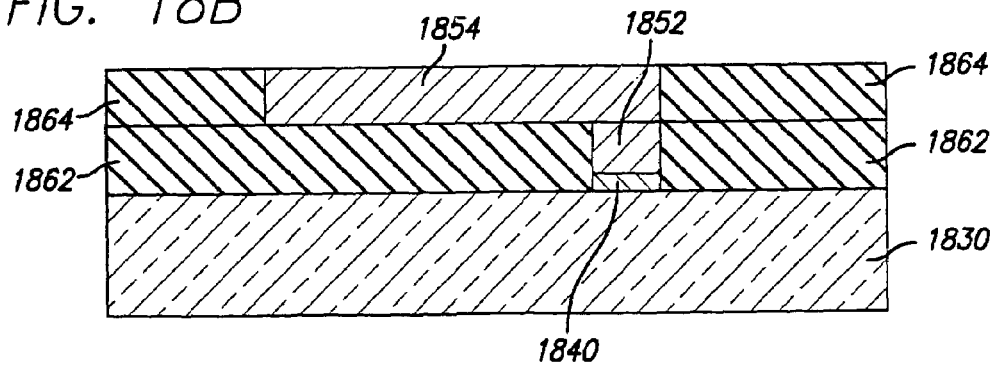
Figure 18C:
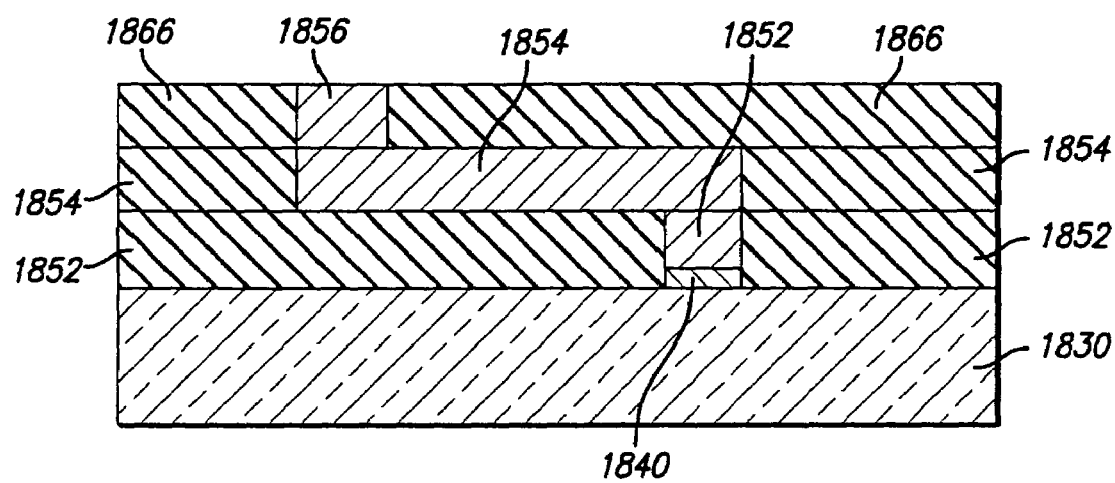
Figure 18D:
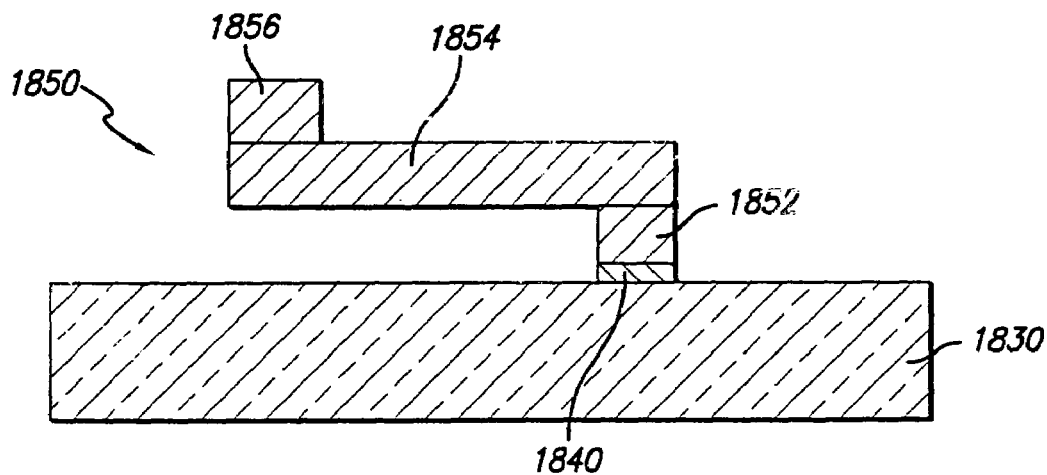

FIGS. 18A–18D illustrate an example of a lithographically formed spring contact 1850 in which distinct post 1852, beam 1854, and tip 1856 portions are separately created. Typically, the post 1852 is created by forming a first masking layer 1862 on integrated circuit 1830 with an opening over terminal 1840. The post portion 1852 is then formed by filling the opening with a material suitable for the post as shown in FIG. 18A. Thereafter, a second masking layer 1864 is formed over the first masking layer 1862, defining an opening that includes the post 1852 and defines the beam 1854. The beam 1854 is then created by filling the opening with a material suitable for the beam as shown in FIG. 18B. The process is then repeated with a third masking layer 1866 defining the tip 1856 as shown in FIG. 18C. Thereafter, the masking layers 1862, 1864, 1866 are removed, leaving interconnect structure 1850 attached to the terminal 1840. It should be noted that a separate contact tip that is pointed or otherwise angled may be attached to the tip portion 1856.

It should be noted that, rather than forming the interconnect elements 1650, 1750, 1850 on the integrated circuit 1630, 1730, 1830, the interconnect elements may be formed separately from the integrated circuit and, once formed, attached to the integrated circuit so as to line up with terminals on dice composing the integrated circuit. It should be apparent that the use of lithographic methods for forming interconnection elements on a integrated circuit, such as the methods described above, allow for the placement of the interconnection elements in just about any location desired on the integrated circuit and the formation of interconnection elements in just about any shape imaginable. Many exemplary techniques and processes for lithographically forming interconnection elements on a substrate, such as semiconductor integrated circuit, and many exemplary interconnection elements shapes are described in the following U.S. patents and patent applications, all of which are incorporated herein by reference in their entirety: U.S. patent application Ser. No. 08/802,054, filed Feb. 18, 1997; U.S. Pat. No. 6,184,053; U.S. patent application Ser. No. 09/032,473, filed Feb. 26, 1998; U.S. patent application Ser. No. 09/205,022, filed Dec. 2, 1998; U.S. patent application Ser. No. 09/205,023, filed Dec. 2, 1998; U.S. patent application Ser. No. 09/473,414, filed Dec. 28, 1999; U.S. patent application Ser. No. 09/474,788, filed Dec. 29, 1999; U.S. patent application Ser. No. 09/710,539, filed Nov. 9, 2000; U.S. patent application Ser. No. 09/781,833, filed Feb. 12, 2001; U.S. patent application Ser. No. 09/795,772, filed Feb. 27, 2001; and U.S. patent application Ser. No. 09/880,658, filed Jun. 13, 2001. Any such interconnection element may be used with the present invention. In addition, the physical and mechanical properties of such interconnection elements may be manipulated by including particular additives in the materials used to form the interconnection elements and/or by heat treating as described above.

Regardless of their shape or the manner in which they are formed, lithographically formed contact springs can, generally speaking, replace any of the wire bond contact springs illustrated in FIGS. 5A through 15C, and sockets (e.g., pads, recesses, vias, holes, etc.) can be provided on a module board for making electrical connections with lithographically formed spring contacts on the integrated circuits.

It should be further noted that contacts other than spring contacts may be used with the present invention. Indeed, any elongate contact protruding from the input/output terminals of an integrated circuit so as to be capable of forming demountable electrical connections with sockets (e.g., pads, recesses, vias, holes, etc.) on a module board can be used with the present invention.

Figure 19:
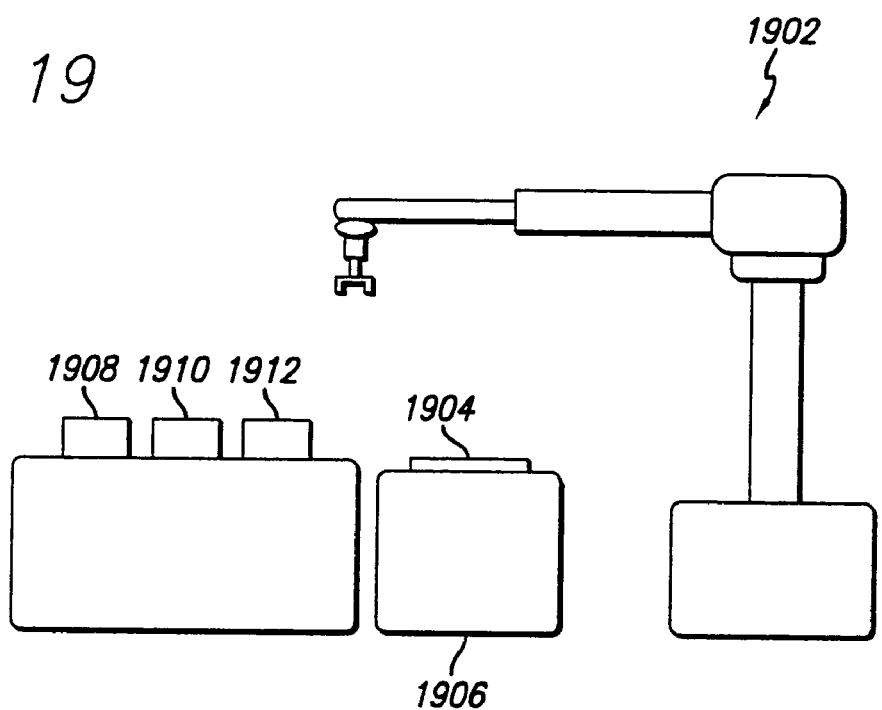
FIG. 19 illustrates a simplified diagram of an exemplary robotic work cell.

FIG. 19 illustrates a simplified illustration of an exemplary robotic work cell that may be used with the process illustrated in FIG. 2. As shown, a robotic arm 1902 picks integrated circuits from bins 1908, 1910, 1912 and places them on module board 1904. Of course, although three bins 1908, 1910, 1912 are illustrated, a different number of bins may be used. The bins 1908, 1910, 1912 may store integrated circuits by speed rating. Alternatively or in addition, bins 1908, 1910, 1912 may store integrated circuits by other categories, such as type of integrated circuit. As mentioned above, many types of robotic work cells are known, and any such robotic cell may be used with this invention. It should also be apparent that a robotic work cell is not necessary to the invention; selection, movement, and mounting of integrated circuits may be done manually or by a combination of automatic and manual means.

It should be noted that module board 1904 may be a test module or board only. That is, a temporary module may be assembled on module board 1904 by temporarily connecting integrated circuits to the module board as described above, after which the temporary assembled module is tested as described above, with the replacement of integrated circuits as need. Once it is determined that a set of integrated circuits operate at a desired operating speed (as described above), however, the integrated circuits are removed from module board 1904 and permanently reassembled on another module board, which serves as the final assembly of the module. Thereafter, the process is repeated. That is, a new module is temporarily assembled and tested on module board 1904, with the replacement of integrated circuits as needed. Once it is determined that the new module operates at a desired operating speed, the integrated circuits are removed from module board 1904 and permanently reassembled on another module board. If module board 1904 is only a test module or board as described above, it is preferably as similar as possible to the module board on which the integrated circuits are permanently assembled after testing.

Referring again to FIG. 2, once a module is demountably assembled at step 208, the module is tested 210 at the expected operating speed of the module, which corresponds to the operating speed bin from which the integrated circuits were taken to assemble the module at step 208. In FIG. 19, a tester 1906 tests the module 1904. As mentioned above, module 1904 will typically include electrical contacts (not shown) for making electrical connections with one or more other elements in an overall electronics system of which the module will be a part. The tester 1906 preferably makes electrical connections with one or more of these contacts. The tester 1906 may, however, alternatively or in addition, make contact with other electrically conductive points on the module 1904. The tester 1906 generates test signals, which are provided to the module 1904, and the module generates response signals, which are provided to the tester 1906.

No particular type of tester 1906 is required by the invention; rather, many testers 1906 suitable for testing electronics modules are known and any such tester may be used with the present invention. The tester 1906 preferably tests the module in such a way as to isolate the cause of the failure of a module by identifying specific integrated circuit or circuits that failed. Alternatively, the tester 1906 may be able to isolate the cause of the failure of a module to a group of integrated circuits, where the group consists of less than all of the integrated circuits that form the module. For example, the tester 1906 may isolate the cause of a module failure to a group of two, or a group of three, etc. integrated circuits on the module, where the module includes more than two or more than three, etc. integrated circuits. Again, such testers are known, and any such tester may be used with the present invention.

Referring again to FIG. 2, if it is determined 212 that the module failed the test 210, the integrated circuit or integrated circuits that failed are removed and replaced with new integrated circuits. Because the connections between the integrated circuits 302 and the module board 314 (referring again to FIG. 3) made at step 208 are readily demountable, it is relatively simple to remove the failed integrated circuits and replace them with new ones. Ways of demounting the exemplary interconnections illustrated in FIGS. 5A through 15C are discussed above with respect to those Figures. As discussed above, a robotic work cell, such as the one illustrated in FIG. 19, may be configured to automatically demounted failed integrated circuits and replace them with new integrated circuits. Alternatively, the integrated circuits may be demounted and replaced manually or by a combination of automatic and manual means. Once the failed integrate circuits have been replaced 214, the module is retested 210. If the module again fails, steps 214 and 210 are repeated.

The failed integrated circuits may be down graded one speed rating unit and reused in a module intended to run at the lower speed rating. Thus, for example, if the failed integrated circuits were rated within the 700 MHz (continuing with the above stared example) category at step 204, but caused the module to fail to perform at 700 MHz at step 210, the failed integrated circuits may be downgraded to the 600 MHz category.

If the module passes the tests 210, 212, the demountable connections between the integrated circuits and the module board may optionally be made permanent at step 216. For example, if temporary connections such as those illustrated in FIGS. 5A, 6, or 7 are used to assemble a module at step 208, the spring contacts 510, 610, 710 may be soldered at step 216 as shown in FIG. 5B. The means by which permanent connections are made, however, is not critical to the invention, and any such means may be used. For example, as illustrated in FIG. 5C, an adhesive may be applied between the integrated circuits and the module board. Another example is illustrated in FIG. 13B, where ends of guide springs 1322 are bent at step 216 (FIG. 2) to secure integrated circuit 1302 to module board 1314. Again, a robotic work cell (not shown) may be used to automatically make the connections permanent 216. Of course, this may be done manually or by a combination of manual and automatic means.

If connections sufficient to secure the integrated circuits to the module board for an indefinite amount of time are made during assembly of the module (step 208 of FIG. 2), then the step of making the connections permanent 216 need not be performed. For example, the step of making the connections permanent 216 may typically be skipped if the module is assembled at step 208 using techniques such as those illustrated in FIGS. 5D, 8, 9, 10, 11, 12A, 12B, or 14A–15C. Of course, any of these connection techniques may be made more secure by nevertheless performing step 216 by, for example, soldering or using an adhesive as illustrated in FIGS. 5B and 5C, or any other means of securing the integrated circuits to the module board.

Figure 1:
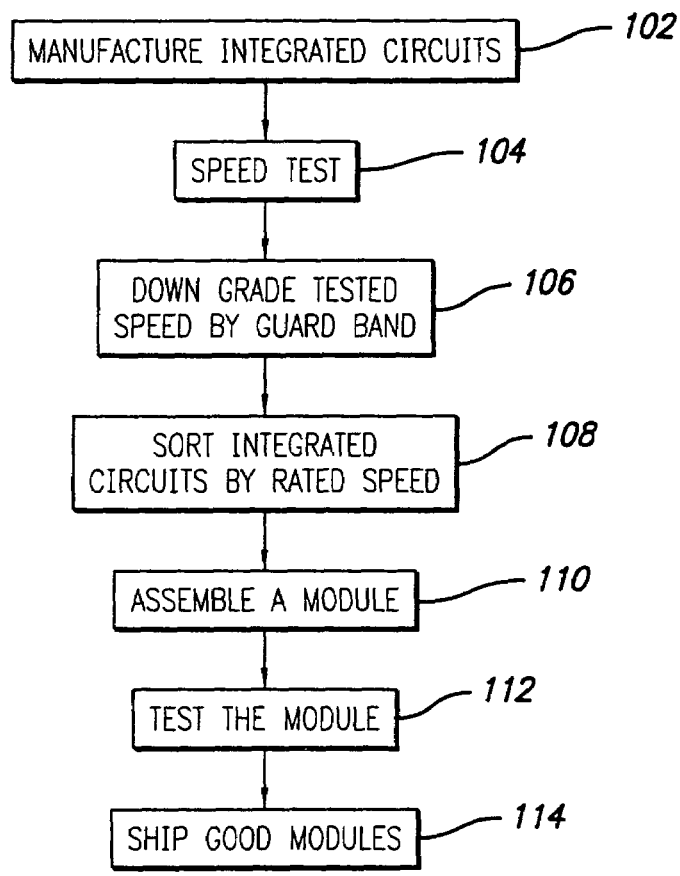
FIG. 1 illustrates common steps in prior art methods of making, rating, and testing electronics modules.

FIG. 20A illustrates three modules 2002, 2012, 2022 assembled using a prior art method, such as the method illustrated in FIG. 1. Mounted on each module 2002, 2012, 2022 are twelve integrated circuits 2006, 2008. Integrated circuits 2006 tested at step 104 of FIG. 1 at an operating speed between at greater than 700 Mhz, but less than 800 MHz. Integrated circuits 2008, however, tested at an operating speed of greater than 800 MHz but less than 800 MHz plus a guard band. Integrated circuits 2008 were therefore down graded at step 106 of FIG. 1 to a rating of 700 MHz. All three modules 2002, 2012, 2022 illustrated in FIG. 20A are rated to operate at 700 MHz—not at 800 MHz, even though twelve of the integrated circuits 2008 (enough to populate one module board) are capable of operating at 800 Mhz or greater.

FIG. 20B illustrates three modules 2032, 2042, 2052 assembled using the exemplary process illustrated in FIG. 2. As shown, using the exemplary process illustrated in FIG. 2, the twelve integrated circuits 2008 capable of operating at 800 MHz were assembled onto board 2042, which is rated to operate at 800 MHz. Modules 2032, 2042, which include only integrated circuits 2006 rated to operate at 700 MHz, are rated to operate at 700 MHz. Thus, using the process illustrated in FIG. 2, a module 2052 rated to operate at 800 MHz was assembled, whereas using the prior art process illustrated in FIG. 1, no 800 MHz module was assembled. Generally speaking, the higher the speed rating of a module, the greater its monetary value.

Figure 21:
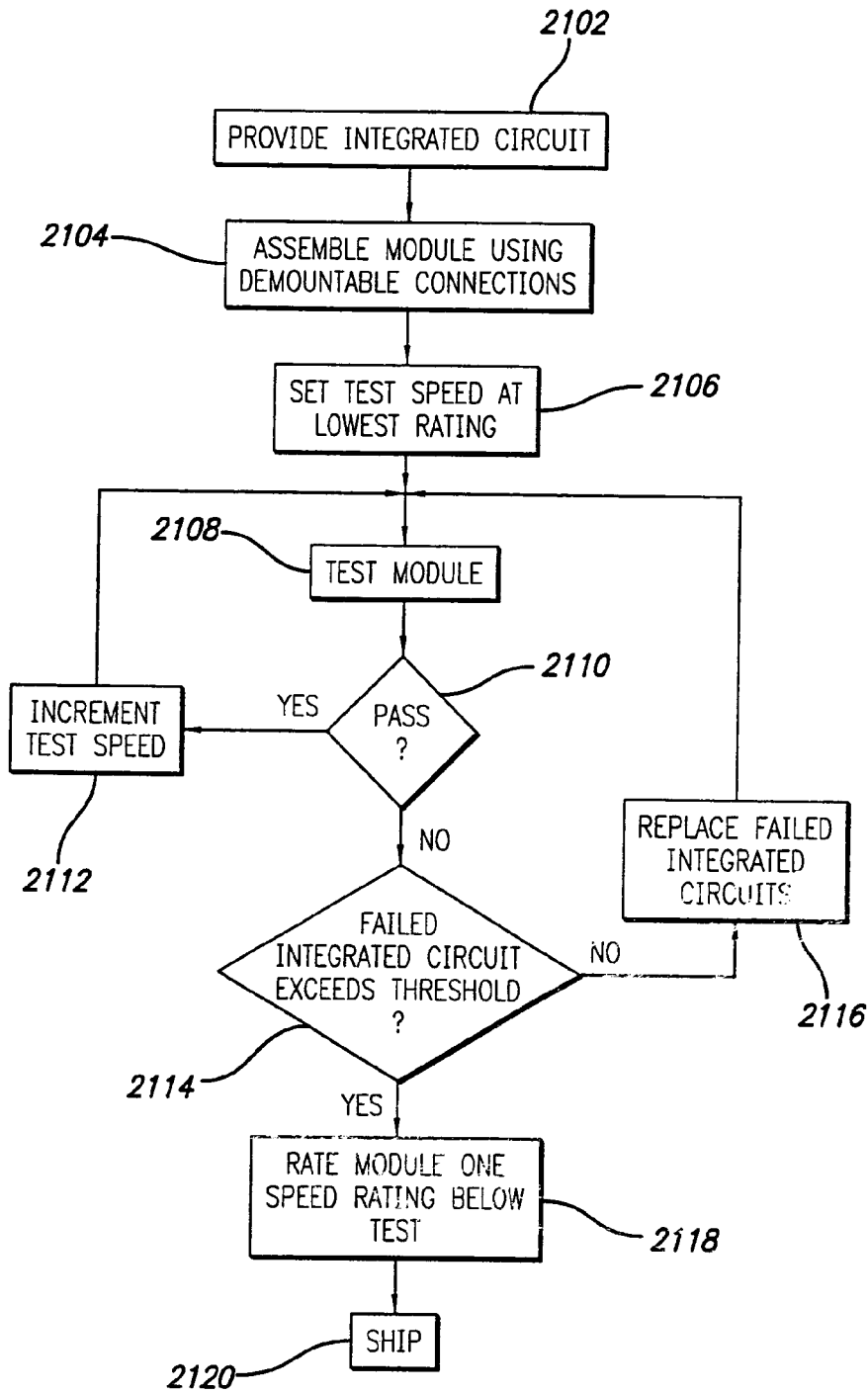
FIG. 21 illustrates another exemplary embodiment of the invention in which a module is assembled and tested.

FIG. 21 illustrates another embodiment of the invention. As with the embodiment illustrated in FIG. 2, the process illustrated in FIG. 21 begins with the provision of integrated circuits 2102. As with the embodiment illustrated in FIG. 2, any method of manufacturing or otherwise obtaining integrated circuits may be used with the embodiment illustrated in FIG. 21.

A module is then assembled 2104. As with the embodiment of FIG. 2, the module is assembled by mounting integrated circuits to a substrate, such as a module board, as generally shown in FIG. 3. Any of the techniques discussed above may be used to form demountable connections between the module board 314 and the integrated circuits 302. Unlike the embodiment of FIG. 2, however, the integrated circuits are not speed tested or sorted prior to being assembled into a module. Rather, the integrated circuits are randomly selected and assembled into the module.

Next testing equipment (not shown) is set to test at the lowest of the speed ratings for the module. For example, if the module is to be made to operate at one of 600 MHz, 700 MHz, and 800 MHz (continuing with the example started above), the testing equipment would initially be set to test the module at a 600 MHz operating speed. As discussed above, many different types of equipment are known for testing such modules, and any such test equipment may be used with the present invention.

The module is then tester at the operating speed at which the test equipment is set 2108. If the module passes the test 2108, 2110, the test equipment is set to test at the next higher operating speed 2112. Continuing with the above example the test equipment would be set to test at a 700 MHz operating speed at step 2112. The module is then retested 2108 at the new operating speed. These steps of testing the module 2108, increasing the test speed if the module passes the test 2112, and retesting the module 2108 are continued until the module fails the test 2110. (Of course, if the module passes the test at the highest rated speed of the module, the module is rated at that speed and shipped. For simplicity, this scenario is not illustrated in FIG. 21.) Once the module fails the test at a given test speed, it is determined whether the number of failed integrated circuits in the module exceeds a given threshold 2114. If not, the failed integrated circuits are removed and replaced 2116, and the module is retested 2108. If the number of failed integrated circuits exceeds the threshold 2114 (which may be zero), the module is rated at the next lowest speed 2118 (which is the highest speed at which the module passed testing) and shipped 2120. Although not shown, the connections between the integrated circuits and the module board may be made permanent if necessary. (Of course, special provisions not shown in FIG. 21 must be made for the case in which step 2118 is reached after testing at the lowest of the possible speed ratings of the module.) Selection of a threshold represents a trade off between quickly finding a combination of integrated circuits that pass the test at step 2108 and ensuring that higher speed integrated circuits are assembled into modules that are eventually rated at the higher speeds. Thus, the threshold may be any number representing a small number of integrated circuits (in which case, the trade off is skewed to quickly finding a combination of integrated circuits that pass the test at step 2108) to a number representing all of the integrated circuits (in which case the trade off is skewed to ensuring that higher speed integrated circuits are assembled into modules that are eventually rated at the higher speeds).

Figure 22:
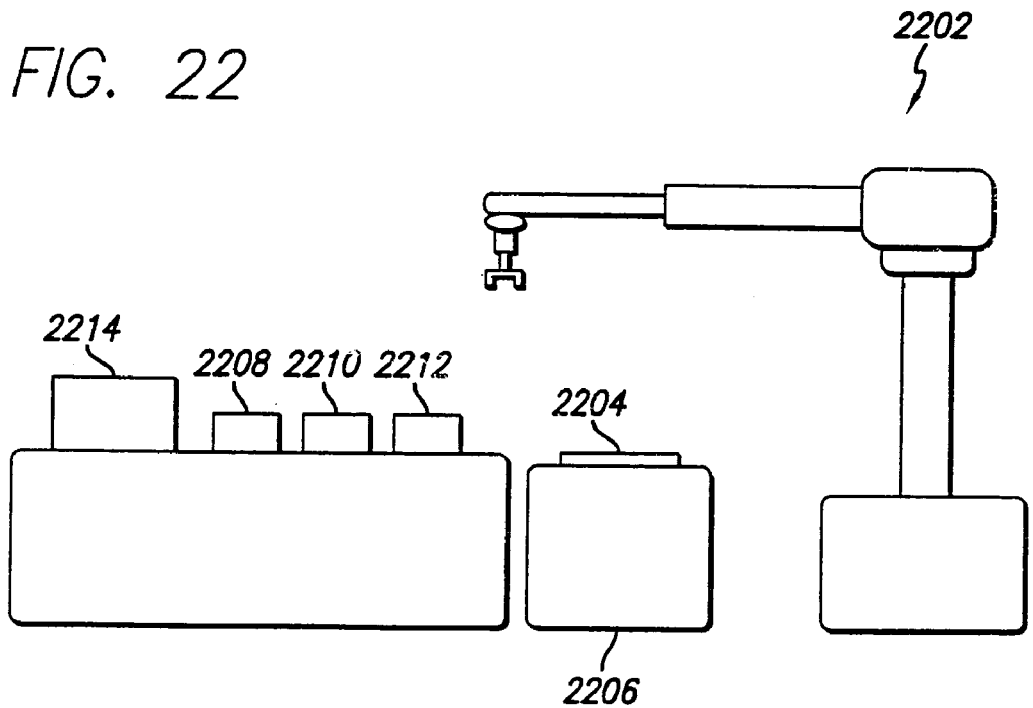
FIG. 22 illustrates another exemplary robotic work cell.

FIG. 22 illustrates a simplified diagram of an exemplary robotic cell that may be used with the process illustrated in FIG. 21. The exemplary robotic cell illustrated in FIG. 22 includes a robotic arm 1902 and bins 2208, 2210, 2212, 2214. In this example, new integrated circuits received at 2102 are stored in bin 2214. Continuing with the above example in which modules having a speed rating of 600 MHz, 700 MHz, and 800 MHz are to be assembled, bin 2208 is for storing integrated circuits with an estimated rating of 600 MHz; bin 2210 is for storing integrated circuits with an estimated rating of 700 MHz, and bin 2212 is for storing integrated circuits with an estimated rating of 800 MHz. Initially, only bin 2214 (the unrated bin) is populated with integrated circuits. Indeed, newly received integrated circuits (which are not speed tested in the process shown in FIG. 21) are initially stored in the unrated bin 2214. Integrated circuits that fail at a particular speed test at step 2108 and are replaced on the module at step 2116 of FIG. 21 may be placed in the one of bins 2208, 2210, 2212 that corresponds to one speed rating below the speed rating of the test the integrated circuit failed at step 2108. Thereafter, in assembling a new module at step 2104 or replacing a failed module at step 2116, the robotic arm may be programmed to select integrated circuits from either the unrated bin 2214 or one of the rated bins 2208, 2210, 2212 that corresponds to the speed rating of the next test to be performed at step 2108 of FIG. 21.

Of course, the robotic cell illustrated in FIG. 21 is exemplary only. The invention does not depend on the use of any particular robotic cell; many robotic cells are known for handling integrated circuits and module assemblies and any such robotic cell may be used with the invention. Indeed, a robotic cell need not be used at all. Selection and handling of the integrated circuits and assembly of the modules may be done entirely manually or by a combination of manual and automatic means.

Figure 23:
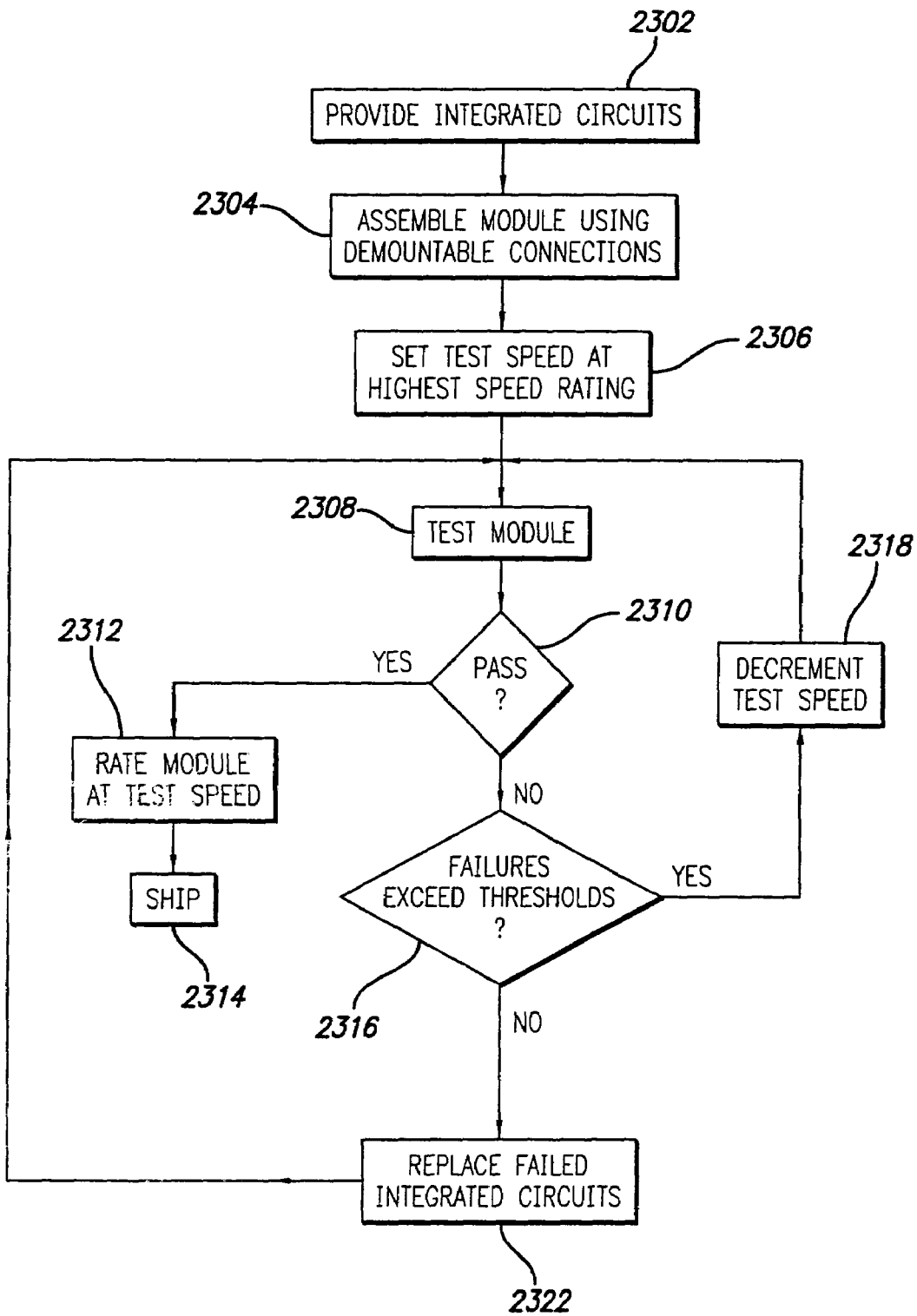
FIG. 23 illustrates yet another exemplary embodiment of the invention in which a module is assembled and tested.

FIG. 23 illustrates yet another embodiment of the invention. As with the previously discussed embodiments, the embodiment illustrated in FIG. 23 begins with the provision of integrated circuits 2302. A module is then assembled 2304 by demountably attaching integrated circuits 302 to a module board 314, such as in FIG. 3. The step of assembling a module 2304 may be the same as or similar to like steps described above with respect to FIGS. 2 or 21. Notably, however, as in FIG. 21, the integrated circuits are not speed tested or sorted by speed prior to assembly of a module 2304.

Test equipment (not shown) is then set to test at the highest of the speed ratings for the module 2306. For example, if the module is to be made to operate at one of 600 MHz, 700 MHz, and 800 MHz (continuing with the example started above), the testing equipment would be initially set to test the module at an 800 MHz operating speed. As discussed above, many different types of equipment are known for testing such modules, and any such test equipment may be used with the present invention. The module is then tested at the operating speed at which the test equipment is set 2308. If the module passes the test 2308, 2310, the module is rated to operate at the tested speed 2312 and is sold and shipped to customers 2314. Of course, the connections between the integrated circuits and the module board may be made permanent if necessary. A new module may then be assembled and the process repeated beginning from the step 2308 of testing the new module. If, on the other hand, the module fails the test 2308, 2310, the integrated circuits on the module that failed are replaced with new integrated circuits 2322 and the module is retested 2308.

For efficiency purposes, one or more steps may optionally be performed between determining that the module failed 2310 and replacing the failed integrated circuits with new integrated circuits 2322. The purpose of such steps is to make some sort of determination that it is no longer worth testing the module at the current testing speed and, consequently, to reduce the testing speed.

One such exemplary step is illustrated as step 2316 in FIG. 23. After determining that the module failed the test 2310, the total number of times the module has failed to pass the test at the current operating speed may be determined. If the number of failures exceeds a threshold 2316, the testing speed may be decremented one unit 2318, and the module retested at the newly set lower testing speed 2308. Continuing with the above example in which the initial testing speed is set at 800 MHz, the testing speed would be decremented to 700 MHz at step 2318, and the module would be retested at step 2308 at 700 MHz.

As discussed above with respect to FIG. 21, selecting the threshold for step 2316 represents a tradeoff between quickly finding a combination of integrated circuits that pass a test at step 2308 and ensuring that higher speed integrated circuits are assembled into modules that are eventually rated at the higher speeds. Thus, the threshold may be any number representing, a small number of integrated circuits (in which case, the trade off is skewed to quickly finding a combination of integrated circuits that pass a test at step 2308) to a number representing all of the integrated circuits (in which case the trade off is skewed to ensuring that higher speed integrated circuits are assembled into modules that are eventually rated at higher speeds).

It should be apparent that the robotic cell illustrated in FIG. 22 may also be used with the process illustrated in FIG. 23. Again, however, no particular robotic cell is required and any may be used; of course, manual means or a combination of manual and automatic means may be used to select and handle integrated circuits and assemble modules.

It should be apparent that one could program a robotic cell, such as the one illustrated in FIG. 22, to follow a variety of processes in selecting integrated circuits and testing modules to achieve any of a variety of optimization goals. For example, one might program a robotic cell to follow a process that ensures that as many higher speed modules are made as possible. Alternatively, one might program the robotic cell to achieve the highest throughput, that is, the greatest chance of successfully placing dice in the maximum possible speed module in the fewest number of test attempts.

FIGS. 24A and 24B illustrate still another exemplary embodiment of the invention. As shown in FIG. 24A, integrated circuits are provided at step 2402, which step may be the same as or similar to like steps discussed above with respect to FIGS. 2, 21, and 23. If a robotic cell 2202 such as the one illustrated in FIG. 22 is used, the integrated circuits may be initially stored in bin 2214. As the integrated circuits are received at step 2402, the integrated circuits are tested to determine their maximum operating speed, and the integrated circuits are grouped by their speed rating 2404. The step of speed testing and sorting the integrated circuits 2404 may be similar to the steps of speed testing 204 and sorting 206 illustrated in FIG. 2 and discussed above. If a robotic cell 2202 such as the one illustrated in FIG. 22 is used, speed tested integrated circuits may be stored in bins 2208, 2210, 2212 corresponding to their particular speed rating. For example, continuing with the above example in which modules are to be made to operate at one of 600 MHz, 700 MHz, and 800 MHz, integrated circuits testing at 600 MHz might be stored in bin 2208, integrated circuits testing at 700 MHz might be stored in bin 2210, and integrated circuits testing at 800 MHz might be stored in bin 2212. Typically, the integrated circuits are grouped by their tested speed rather than their tested speed less a guard band. Although there are many ways to speed test an integrated circuit and any such way may be used with the present invention, one way of speed testing is to temporarily assemble a module on module board 2204 using untested integrated circuits from bin 2214. The integrated circuits may then be tested by tester 2206 to obtain a speed rating for each integrated circuit on module guard 2204. Thereafter, each individual integrated circuit may be stored in one of bins 2208, 2210, 2212 according to the integrated circuit's tested operating speed. The process illustrated in FIG. 24A is repeated periodically as new integrated circuits are received at step 2402.

As soon as enough integrated circuits have been sorted into at least one of the speed groups to build a module at that speed group, the process illustrated in FIG. 24B may begin. The process illustrated in FIG. 24A may continue to operate, such that new integrated circuits are continually received, speed tested, and sorted into speed groups.

As shown, the process illustrated in FIG. 24B begins by determining which of the operating speed groups have sufficient integrated circuits (that have been received, tested, and sorted by the process of FIG. 24A) to build a module. There are a variety of ways to determine whether a speed group has enough integrated circuits to build a module.

One such way is simply to keep track of the number of modules in each speed group. For example, a running count could be kept of the number of tested but as yet unused integrated circuits that correspond to each speed group. While the count for a particular speed group exceeds the number of integrated circuits needed to build a module, there are enough integrated circuits to build a module for that speed group.

A robotic cell, such as the one illustrated in FIG. 22, could be used to keep such a count. Continuing with the above example in which modules at three different operating speeds—600 MHz, 700 MHz, and 800 MHz—are to be made, tested integrated circuits are stored in one of bins 2208, 2210, 2212 in accordance with the tested operating speed of the integrated circuits. For example, integrated circuits tested to operate at 600 MHz are stored in bin 2208, integrated circuits tested to operate at 700 MHz are stored in bin 2210, and integrated circuits tested to operate at 800 MHz are stored in bin 2212. The robotic cell could be programmed to keep a count of the number of integrated circuits in each bin 2208, 2210, 2212 Alternatively, the robotic cell could weigh each bin 2208, 2210, 2212, and estimate the number of integrated circuits in each bin based on its weight.

At step 2408, an operating speed is selected. The operating speed is selected from the groups identified at step 2406. If only one group is identified at step 2406, then the operating speed of that group is selected. If on the other hand, more then one group is identified at step 2406, then one of those groups is selected at step 2408. The particular way in which the group is selected at step 2408 may vary with the goals of the overall process of assembling electronics modules illustrated in FIGS. 24A and 24B. For example, if it is desired to assemble higher speed modules first, the group identified at step 2406 with the highest operating speed is selected at step 2408. As another example, the speed groups may be preassigned a priority and the speed group selected that has the highest priority among the groups having sufficient integrated circuits to build a module. Of course, other selection strategies may be pursued at step 2408. Indeed, the selection at step 2408 may be random.

Once an operating speed is selected at step 2408, a module is demountably assembled at step 2410. This step may be similar to step 206 of FIG. 2, step 2104 of FIG. 21, or step 2304 of FIG. 23, as discussed above. The demountably assembled module is then tested at step 2412 at the operating speed selected at step 2410. Testing at step 2412 may be as described above with respect to similar testing steps in FIGS. 2, 21, and 23.

A robotic cell, such as the one illustrated in FIG. 22, may assemble a module at step 2410 by retrieving tested integrated circuits from one of bins 2208, 2210, or 2212 that corresponds to the operating speed selected at step 2206 and demountably attaching the integrated circuits to substrate 2204. The demountably assembled module may then be tested at step 2412 by tester 2206.

If the module passes the test 2214, the module is rated to operate at the selected operating speed at step 2418 and shipped to customers at step 2420. As with the processes illustrated in FIGS. 2, 21, and 23, the demountable connections between the integrated circuits and the substrate may be made permanent before shipping the module. The process of FIG. 24B may then be repeated to assemble and test additional modules. All the while, the process of FIG. 24A may continue to operate or may operate periodically to continually add new integrated circuits to the speed groups.

If the module fails the test 2214, the integrate circuits that caused the module to fail are identified and replaced with new integrated circuits that correspond to the selected operating speed 2416. This may be similar to step 214 in FIG. 2, step 2116 in FIG. 21, or step 2322 in FIG. 23, as discussed above. A robotic cell, such as the one illustrated in FIG. 22, may remove the failed integrated circuits and retrieve replacement integrate circuits from the appropriate bin 2208, 2210, 2212. The failed integrated circuits may be down graded one speed rating and re-binned, discarded, or used in other applications.

Once the failed integrated circuits have been replaced 2416, the module is retested at step 2412 and the process repeats from there. Of course, error recovery schemes and special procedures for terminating the process must be included in the process illustrated in FIG. 24A and 24B. Procedures must also be put in place for handling integrated circuits that fail to operate at the lowest acceptable speed. Such schemes and procedures, however, are not critical to the invention and are well within the skill of those practicing in the relevant field. Thus, such schemes and procedures are not described herein.

Figure 25:
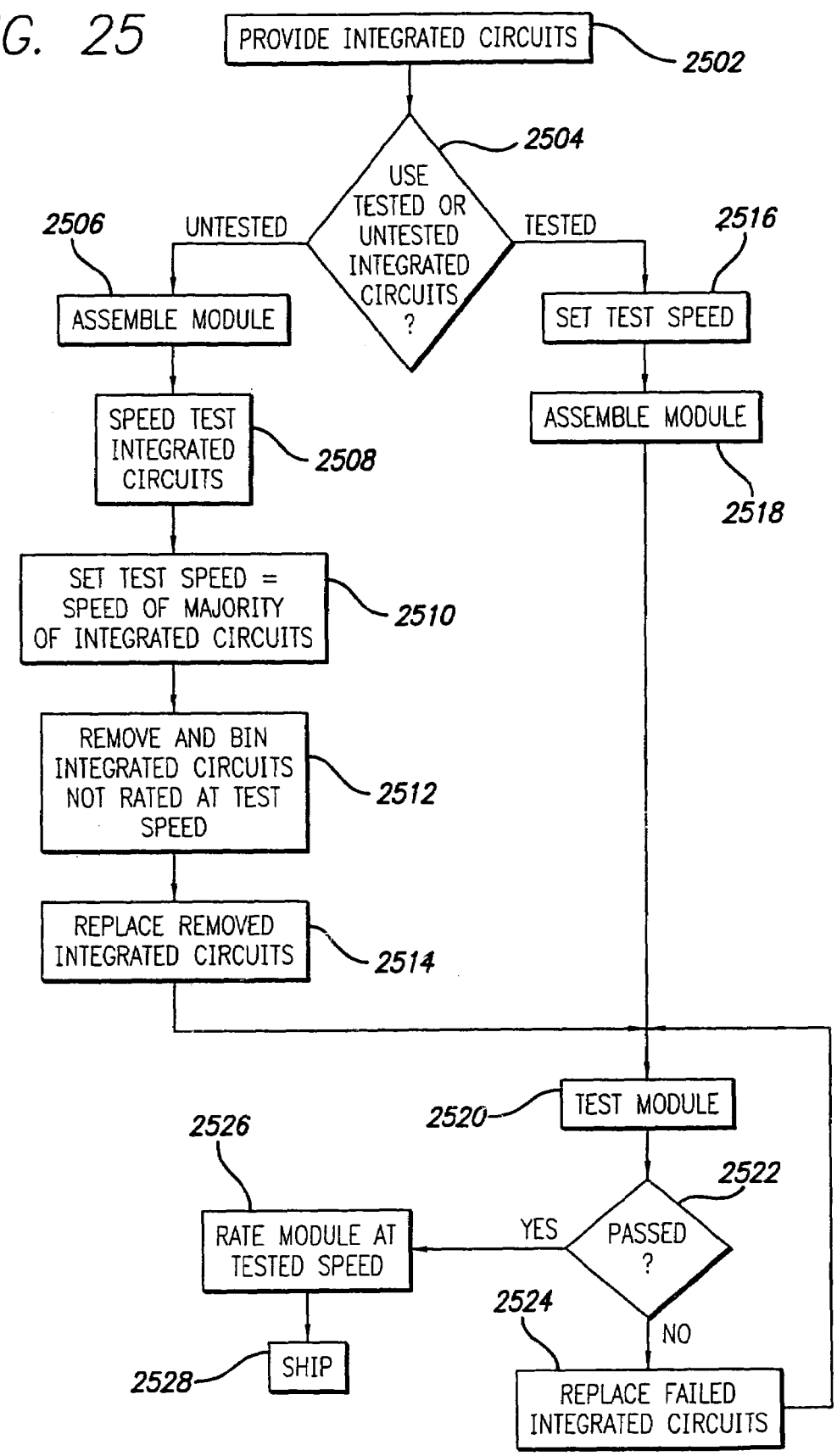
FIG. 25 illustrates yet another exemplary embodiment of the invention in which a module is assembled and tested.

FIG. 25 illustrates yet another exemplary embodiment of the invention. A robotic cell such as the one illustrated in FIG. 22 may be used to implement the exemplary process illustrated in FIG. 25.

As shown in FIG. 25, integrated circuits are provided at step 2502, which step may be the same as or similar to like steps discussed above with respect to FIGS. 2, 21, 23, and 24A. If a robotic cell, such as the one illustrated in FIG. 22 is used, newly received integrated circuits are stored in bin 2214. As will be discussed below, integrated circuits that have been speed tested are stored in one of bins 2208, 2210, 2212, each of which preferably corresponds to one of the possible speed ratings of the modules that are to be built. Continuing with the above example in which modules are to be made to operate at one of 600 MHz, 700 MHz, and 800 MHz, integrated circuits tested to operate at 600 MHz might be stored in bin 2208, integrated circuits tested to operate at 700 MHz might be stored in bin 2210, and integrated circuits tested to operate at 800 MHz might be stored in bin 2212. Of course, more or fewer such bins may be used in accordance with the number of different operating speeds for which modules are to be built.

At step 2504, it is determined whether to build a module using tested or untested integrated circuits—that is, whether to build a module from integrated circuits stored in bin 2214 (untested integrated circuits) or from one of bins 2208, 2210, or 2212 (tested integrated circuits). This determination may be based on whether any of bins 2208, 2210, or 2212 contain enough tested integrated circuits to build a module. For example, if one or more of bins 2208, 2210, or 2212 includes enough integrated to build a module, the process of FIG. 25 may branch at step 2504 to step 2516, where a lest speed is set. Alternatively, the determination made at step 2504 may be made on other criteria.

The test speed set at step 2516 corresponds to one of the possible operating speeds of the modules for which there are enough tested integrated circuits to build a module. If there are sufficient numbers of tested integrated circuits in only one operating speed category, then that operating speed is set as the test speed at step 2516. If, on the other hand, there are sufficient numbers of tested integrated circuits in more than one operating speed category, then one of those operating speed categories is selected and set as the test speed set at step 2516. Such selection may be arbitrary or may be designed to further particular goals of the overall process of assembling electronics module illustrated in FIG. 25. For example, if it is desired to assemble higher speed modules first, the test speed may be set as the operating speed corresponding to the highest speed for which there are sufficient tested integrated circuits to assemble a module. The criteria used to select a test speed at step 2516, however, is not critical to the invention, and any criteria may be used.

Once a test speed is selected at step 2516, a module is demountably assembled using tested integrated circuits that correspond to the selected test speed. This step may be the same as or similar to step 206 of FIG. 2, step 2104 of FIG. 21, step 2304 of FIG. 23, or step 2410 of FIG. 24B, as discussed above. If a robotic cell such as the one illustrated in FIG. 22 is used, the robotic cell may remove integrated circuits from one of bins 2208, 2210, or 2212 and demountably attach the integrated circuits to substrate 2204.

If, on the other hand, it is determined at step 2504 to use untested integrated circuits to assemble the module, the process of FIG. 25 branches at step 2504 to step 2506, where a module is demountably assembled using untested integrated circuits newly received at step 2502. For example, if a robotic cell such as the one illustrated in FIG. 22 is used, the robotic cell may remove integrated circuits from bin 2214 and demountably attach the integrated circuits to substrate 2204. Otherwise, the step of assembling the module 2506 may be the same as or similar to step 2518.

The assembled module is then tested at the various operating speeds for which modules are to be built 2508. Such testing results in each integrated circuit being given an initial designated speed rating. At step 2510, a test speed is selected that corresponds to the speed rating of a majority of the just-tested integrated circuits. At step 2512, integrated circuits that do not correspond to the test speed set at step 2510 are removed from the module and are grouped or binned (for example, in bins 2208, 2210, 2212) in accordance with their speed rating. The removed integrated circuits are then replaced by new integrated circuits at step 2514. The new integrated circuits may be untested integrated circuits (for example, selected from bin 2214 of the robotic cell of FIG. 22) or may be integrated circuits previously tested to operate at the set test speed (for example, selected from one of bins 2208, 2210, or 2212 corresponding to the set test speed).

Regardless of whether a module was created by the steps 2506–2514 or steps 2516–2518, the assembled module is tested at step 2520. Testing may be as described above with respect to similar steps in FIGS. 2, 21, 23, and 24B.

If the module passes the test 2520, 2522, the module is rated to operate at the set test speed at step 2526 and shipped to customers at step 2528. As with the processes illustrated in FIGS. 2, 21, 23, and 24B, the demountable connections between the integrated circuits and the substrate may be made permanent before shipping the module. The process illustrated in FIG. 25 may then be repeated to assemble additional modules. It should be apparent that the process may be repeated beginning with step 2504. It should also be apparent that new integrated circuits may be provided at step 2502 at any time during the process of FIG. 25.

If the module fails the test 2520, 2522, the integrated circuits that caused the module to fail are identified and replaced with new integrated circuits at step 2524. The new integrated circuits may be previously tested integrated circuits whose speed rating corresponds to the set test speed or may be as yet untested integrated circuits. The integrated circuits that caused the module to fail may be down graded one speed rating from the set test speed and binned accordingly. Alternatively, these integrated circuits may be discarded or used in other applications. Once the failed integrated circuits have been replaced 2524, the module is retested at step 2520 and the process repeats from there.

Of course, error recovery schemes and special procedures for terminating the process must be included in the process illustrated in FIG. 25. Procedures may also be put in place for handling integrated circuits that fail to operate at the lowest acceptable speed. Such schemes and procedures, however, are not critical to the invention and are well within the skill of those practicing in the relevant field. Thus, such schemes and procedures are not described herein.

It should be apparent that many variations of the emibodiments of the invention discussed above are possible and fall within the spirit and scope of the present invention. For example, hybrids of the embodiments illustrated in FIGS. 2, 19, 21, 24A, and 24B possible. For example, supposing the module to be made is to operate at one of four possible operating speeds—500 MHz, 600 MHz, 700 MHz, or 800 MHz—a gross speed test and sort may be used to determine whether a given integrated circuit falls within the higher two speeds (i.e., 700 MHz or greater) or within the lower two speeds (i.e., less than 700 MHz). Thereafter, the embodiments illustrated in FIGS. 18 or 19 could be used to assemble and test modules using the integrated circuits that are sorted into one of the two groups (continuing with the above example).

Another exemplary variation of the embodiments discussed above is as follows: although the protruding or elongate contacts (e.g., element 410 of FIG. 4A, element 510 of FIGS. 5A–5D, element 610 of FIG. 6, element 710 of FIG. 7, element 810 of FIG. 8, element 910 of FIG. 9, element 1010 of FIG. 10, element 1110 of FIGS. 11A–D, element 1210 of FIGS. 12A–12D, element 1310 of FIG. 13A–13B, element 1650 of FIGS. 16B–16C, element 1750 of FIGS. 17B–17C, or element 1850 of FIG. 18D) are formed on integrated circuits and the sockets are formed on the module board in the embodiments described above, the protruding or elongate contacts may alternatively be formed on the module board and the sockets formed on the integrated circuits. For example, the protruding contacts may be formed on input/output terminals on the module board.

Yet another example of possible variations include the following: although the module is described above as consisting of a plurality of integrated circuits mounted to a module board, the module could alternatively consist of a plurality of interconnected module boards, each having one or more integrated circuits mounted thereto. As yet another example of a modification, and as mentioned above, any substrate suitable for supporting and interconnecting integrated circuits may be used in place the module board utilized in the above described exemplary embodiments of the invention.

Still another exemplary way in which the above embodiments could be modified is as follows. The module board 314 illustrated in FIG. 3, 1904 of FIG. 19, or 2204 of FIG. 22 could alternatively be a special test board, configured to provide an environment similar to a module board or other module substrate. Such a test board may form part of the tester 1906 (FIG. 19), or may be made to connect readily to the tester. In such a case, once a set of integrated circuits passes tests and is rated at the operating speed of the test, the integrated circuits would be removed from the special test board, and securely mounted to a module board or other module substrate, and then sold and shipped.

What is claimed is:

1. A method of making an electronics module, where said electronics module is to operate at one of a predetermined plurality of operating speeds, said method comprising:
   providing a plurality of integrated circuits;
   assembling an electronics module by demountably attaching selected ones of said integrated circuits to a module substrate;
   testing said demountably assembled module at a selected one of said operating speeds;
   if said module fails said testing:
      removing at least one of said integrated circuits determined to have caused said failure form said module substrate,
      replacing said at least one removed integrated circuit with another of said plurality of integrated circuits, and
      repeating said testing step and, if said module again fails said testing, said removing, replacing, and repeating steps,
   further comprising grouping said plurality of integrated circuits in accordance with said operating speeds,
   wherein:
      said step of assembling an electronics module comprises selecting said integrated circuits from one of said groups; and
      said selected one of said operating speeds corresponding to said one of said groups.

2. The method of claim 1, wherein said step of grouping a plurality of integrated circuits in accordance with said operating speeds comprises:
   determining an actual operating speed of each said integrated circuit; and
   grouping said integrated circuits in accordance with said actual operating speeds.

3. The method of claim 1, wherein said step of grouping a plurality of integrated circuits in accordance with said operating speeds comprises:
   determining an actual operating speed of each said integrated circuit;
   subtracting a guard band from said actual operating speed to obtain a guard-banded operating speed; and
   grouping said integrated circuits in accordance with said guard-banded operating speeds.

4. The method of claim 1, wherein:
   each integrated circuit includes a plurality of input/output terminals and a plurality of conductive elongate interconnection elements attached to said input/output terminals, and
   said module substrate includes a plurality of contact locations for contacting said elongate interconnection elements.

5. The method of claim 4, wherein said step of assembling said module comprises:
   bringing elongate interconnection elements attached to said selected integrated circuits into contact with corresponding ones of said contact locations, and
   demountably securing said selected integrated circuits to said module substrate.

6. The method of claim 5, wherein said step of demountably securing comprises applying a temporary force to said selected integrated circuits in a general direction of said module substrate.

7. The method of claim 6, wherein said step of removing said at least one integrated circuit comprises:
   removing said temporary force from said at least one integrated circuit, and
   moving said at least one integrated circuit away from said module substrate.

8. The method of claim 5, wherein said step of demountably securing comprises clipping said selected integrated circuits to said module substrate.

9. The method of claim 8, wherein said step of removing said at least one integrated circuit comprises:
   unclipping said at least one integrated circuit, and
   moving said at least one integrated circuit away from said module substrate.

10. The method of claim 5, wherein said step of demountably securing comprises wedging elongate interconnection elements attached to said selected integrated circuits in corresponding ones of said contact locations.

11. The method of claim 10, wherein said step of removing said at least one integrated circuit comprises removing said elongate interconnection elements attached to said at least one integrated circuit from corresponding ones of said contact locations.

12. The method of claim 4, wherein said conductive elongate interconnection elements comprise spring contacts.

13. The method of claim 4, wherein said contact locations are selected from a group consisting of recesses, terminals, pads, holes, and vias.

14. The method of claim 1 further comprising:
if said module passes said testing, permanently securing to said module substrate said integrated circuits demountably secured to said module substrate.

15. The method of claim 14, wherein said step of permanently securing comprises soldering said elongate interconnection elements attached to said integrated circuits to corresponding ones of said contact locations.

16. The method of claim 14, wherein said step of permanently securing comprises applying an adhesive to adhere said integrated circuits to said module substrate.

17. The method of claim 1, wherein said assembling said electronics module comprises utilizing at least one die edge registration fixture formed on said module substrate to demountably attach said selected integrated circuits to said module substrate.

18. The method of claim 1, wherein said assembling said electronics module comprises utilizing a robotic work cell to demountably attach said elected integrated circuits to said module substrate.

19. The method of claim 1, further comprising, if said module fails said testing, determining a number of said integrated circuits attached to said module substrate that caused said module to fail said testing.

20. The method of claim 19, wherein said steps of removing at least one of said integrated circuits, replacing said at least one removed integrated circuit, and repeating said testing are performed only if said module fails said testing and said number of integrated circuits attached to said module substrate that caused said module to fail said testing is less than a threshold number.

21. The method of claim 1 further comprising, if said module passes said testing, rating said module at said selected operating speed.

22. A method of making an electronics module, where said electronics module is to operate at one of a predetermined plurality of operating speeds, said method comprising:
providing a plurality of integrated circuits;
assembling an electronics module by demountably attaching selected ones of said integrated circuits to a module substrate;
testing said demountably assembled module at a selected one of said operating speeds;
if said module fails said testing:
removing at least one of said integrated circuits determined to have caused said failure form said module substrate,
replacing said at least one removed integrated circuit with another of said plurality of integrated circuits, and
repeating said testing step and, if said module again fails said testing, said removing, replacing, and repeating steps,
if said module passes said testing:
removing said integrated circuits from said module substrate, and
permanently securing said integrated circuits to a second module substrate.

23. A method of making an electronics module, where said electronics module is to operate at one of a predetermined plurality of operating speeds, said method comprising:
providing a plurality of integrated circuits;
assembling an electronics module by demountably attaching selected ones of said integrated circuits to a module substrate;
testing said demountably assembled module at a selected one of said operating speeds;
if said module fails said testing:
removing at least one of said integrated circuits determined to have caused said failure form said module substrate,
replacing said at least one removed integrated circuit with another of said plurality of integrated circuits, and
repeating said testing step and, if said module again fails said testing, said removing, replacing, and repeating steps,
further comprising, if said module fails said testing, determining a number of times said module has failed said testing at said selected operating speed.

24. The method of claim 23, wherein said steps of removing at least one of said integrated circuits, replacing said at least one removed integrated circuit, and repeating said testing are performed only if said module fails said testing and said number of times said module has failed said testing at said selected operating speed is less than a threshold number.

25. The method of claim 24 further comprising repeating said testing step at a newly selected operating speed that is less than an operating speed selected during a previous execution of said testing step.

* * * * *